United States Patent
Saito et al.

(10) Patent No.: US 6,301,089 B1
(45) Date of Patent: Oct. 9, 2001

(54) SPIN-VALVE TYPE MAGNETORESISTIVE THIN FILM ELEMENT COMPRISING FREE MAGNETIC LAYER HAVING NIFE ALLOY LAYER

(75) Inventors: Masamichi Saito; Naoya Hasegawa, both of Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/366,019

(22) Filed: Aug. 2, 1999

(30) Foreign Application Priority Data

Aug. 4, 1998 (JP) .................................................. 10-220608

(51) Int. Cl.[7] ...................................................... G11B 5/39
(52) U.S. Cl. ........................................ 360/324.12; 360/314
(58) Field of Search ................................ 360/324.12, 314

(56) References Cited

U.S. PATENT DOCUMENTS

| | | | |
|---|---|---|---|
| 5,159,513 | 10/1992 | Dieny et al. | 360/113 |
| 5,206,590 | 4/1993 | Dieny et al. | 324/252 |
| 5,287,238 | 2/1994 | Baumgart et al. | 360/113 |
| 5,373,238 | 12/1994 | McGuire et al. | 324/252 |
| 6,127,053 * | 10/2000 | Lin et al. | 428/692 |
| 6,141,191 * | 10/2000 | Lee et al. | 360/324.1 |
| 6,146,776 * | 11/2000 | Fukuzawa et al. | 428/692 |
| 6,153,062 * | 11/2000 | Saito et al. | 204/192.2 |

* cited by examiner

*Primary Examiner*—Jefferson Evans
(74) *Attorney, Agent, or Firm*—Brinks Hofer Gilson & Lione

(57) ABSTRACT

A spin-valve type magnetoresistive thin film element includes at least one antiferromagnetic layer, a pinned magnetic layer in contact with the antiferromagnetic layer, a nonmagnetic electrically conductive layer formed on the pinned magnetic layer, with a free magnetic layer formed thereon, a bias layer for orienting the magnetization of the free magnetic layer to a direction intersecting the magnetization direction of the pinned magnetic layer, and an electrically conductive layer for supplying a sensing current to the pinned magnetic layer, the nonmagnetic electrically conductive layer and the free magnetic layer. The free magnetic layer is composed of a NiFe alloy film and has a thickness in a range of 30 to 100 Å. When the composition of the NiFe alloy is properly determined, the magnetostriction constant of the free magnetic layer can be controlled to be $-2 \times 10^{-6}$ to $1 \times 10^{-6}$, and more preferably $-0.5 \times 10^{-6}$ to 0, resulting in reduced anisotropic dispersion due to height direction due to the magnetoelastic effect. The element has reduced Barkhausen noise and a high rate of change in resistance.

21 Claims, 15 Drawing Sheets

SPIN-VALVE TYPE MAGNETORESISTIVE THIN FILM ELEMENT COMPRISING FREE MAGNETIC LAYER HAVING NIFE ALLOY LAYER

BACKGROUND OF THE INVENTION

1. Field of the Invention

The present invention relates to a spin-valve type magnetoresistive thin film element having an electrical resistance which changes by the relation between the magnetization direction of a pinned magnetic layer and the magnetization direction of a free magnetic layer affected by an external magnetic field. In particular, the present invention relates to a spin-valve type magnetoresistive thin film element in which the saturated magnetoresistive constant of a free magnetic layer is properly controlled to reduce Barkhausen noise.

2. Description of the Related Art

A spin-valve type magnetoresistive thin film element is one type of giant magnetoresistive (GMR) element using giant magnetoresistance, and is used to detect recorded magneticfields from recording media, such as hard disks.

A spin-valve type magnetoresistive thin film element having the simplest configuration includes four layers, that is, a free magnetic layer, a nonmagnetic electrically conductive layer, a pinned magnetic layer, and an antiferromagnetic layer, in that order from the bottom. A hard magnetic bias layer and an electrical lead layer are formed on the two outer faces of the layered configuration.

The antiferromagnetic layer is typically composed of an iron-manganese (FeMn) alloy or a nickel-manganese (NiMn) alloy, and the pinned magnetic layer and the free magnetic layer are typically composed of a nickel-iron (NiFe) alloy. The nonmagnetic electrically conductive layer is typically composed of copper, and the hard magnetic bias layer is typically composed of a cobalt-platinum (CoPt) alloy.

The pinned magnetic layer is formed so as to come into contact with the antiferromagnetic layer. When the antiferromagnetic layer is composed of an FeMn alloy, the formation of the layer is performed in a magnetic field. When the antiferromagnetic layer is composed of a NiMn alloy, the layer is annealed in a magnetic field. As a result, the magnetization of the pinned magnetic layer is pinned in the height direction (the direction of the leakage or fringing magnetic field from the recording medium) to generate a single-domain state. The magnetization of the free magnetic layer is oriented in the track width direction by a biasing magnetic field from the hard magnetic bias layer. The relative angle defined by the magnetization of the free magnetic layer and the magnetization of the pinned magnetic layer is 90°.

In the spin-valve type magnetoresistive thin film element, a sensing current is applied from the electrical lead layer to the pinned magnetic layer, the nonmagnetic electrically conductive layer and the free magnetic layer. When a fringing magnetic field is applied from the recording medium, the magnetization of the free magnetic layer varies from the track width direction to the direction of the fringing magnetic field. A change in the magnetization direction in the free magnetic layer causes a change in electrical resistance of the element, in connection with the magnetization direction of the pinned magnetic layer.

In the spin-valve type magnetoresistive thin film element composed of metallic layers, the upper and lower faces and a height side face are covered with an insulating or gap layer composed of, for example, $Al_2O_3$, and another side face at the air-bearing surface (ABS) side or at the front side, which is away from the height side face, is exposed. Thus, a tensile stress in the height direction is applied to the central region of the free magnetic layer of the spin-valve type magnetoresistive thin film element, whereas a compressive stress is applied to two end regions of the free magnetic layer.

As described above, a hard magnetic bias layer, magnetized in the track width direction, is formed on two sides of the free magnetic layer, and the hard magnetic bias layer unifies the magnetization of the free magnetic layer in the track width direction.

The effect of the hard magnetic bias layer is most noticeable at two end regions of the free magnetic layer, and is moderated towards the central portion of the free magnetic layer, away from the hard magnetic bias layer. Thus, the central portion of the free magnetic layer has a large magnetoelastic effect defined by the stress and the magnetostriction constant applied to the free magnetic layer.

The magnetostriction constant of the free magnetic layer has a positive value due to the tensile stress in the height direction applied to the central region of the free magnetic layer. As the positive magnetostriction constant increases, anisotropic magnetic dispersion in the height direction due to the magnetoelastic effect increases, and thus the height direction becomes the easy axis of the magnetization. Such a state facilitates inclination of the magnetization in the height direction in the central region of the free magnetic layer and thus facilitates generation of Barkhausen noise.

On the other hand, a negative magnetostriction constant of the free magnetic layer desirably causes an easy axis of magnetization to be in the track width direction in the central region of the free magnetic layer. Anisotropic magnetic dispersion due to the magnetoelastic effect, however, occurs at the two end regions of the free magnetic layer in which a compressive stress is applied in the height direction, and hence, the height direction will be an easy axis of magnetization.

Since the two end regions of the free magnetic layer are significantly affected by the hard magnetic bias layer, which is magnetized in the track width direction, the anisotropic magnetic dispersion in the height direction due to the magnetoelastic effect is considered to be slight compared to that in the central region of the free magnetic layer. When the free magnetic layer has a large positive magnetostriction constant, the anisotropic magnetic dispersion becomes considerably large in the height direction due to the magnetoelastic effect.

In such a state, magnetization at the two end regions of the free magnetic layer tends to incline in the height direction and facilitates the generation of Barkhausen noise.

SUMMARY OF THE INVENTION

Accordingly, it is an object of the present invention to provide a spin-valve type magnetoresistive thin film element which has a free magnetic layer having properly adjusted thickness and composition to suppress the magnetostriction constant in the free magnetic layer within a proper range so that Barkhausen noise is reduced.

An aspect of the present invention is a spin-valve type magnetoresistive thin film element comprising at least one antiferromagnetic layer, a pinned magnetic layer in contact with the antiferromagnetic layer, the magnetization direction of the pinned magnetic layer being fixed by an anisotropic exchange magnetic field with the antiferromagnetic layer, a nonmagnetic electrically conductive layer formed between the pinned magnetic layer and a free magnetic layer, a bias layer for orienting the magnetization of the free magnetic layer to a direction intersecting the magnetization direction of the pinned magnetic layer, and an electrically conductive layer for supplying a sensing current to the pinned magnetic layer, the nonmagnetic electrically conductive layer and the free magnetic layer. The free magnetic layer includes a NiFe alloy film and has a thickness in a range of 30 to 100 angstrom.

In another embodiment, the antiferromagnetic layer may be formed above the free magnetic layer, and the NiFe alloy film, as the constituent of the free magnetic layer, has a Ni content in a range of preferably 82 to 85 atomic percent, and more preferably 82.7 to 84.4 atomic percent.

In another embodiment, the antiferromagnetic layer may be formed below the free magnetic layer, and the NiFe alloy film, as the constituent of the free magnetic layer, has a Ni content in a range of preferably 81 to 83.7 atomic percent and more preferably 81.6 to 82.5 atomic percent.

In another embodiment, two antiferromagnetic layers may be formed, one above and one below the free magnetic layer, and the NiFe alloy film, as the constituent of the free magnetic layer, has a Ni content in a range of preferably 81.7 to 84 atomic percent, and more preferably 82.3 to 83 atomic percent.

In these embodiments, the magnetostriction constant of the free magnetic layer can be controlled to be $-2\times10^{-6}$ to $1\times10^{-6}$, and more preferably $-0.5\times10^{-6}$ to 0.

Another aspect of the present invention is a spin-valve type magnetoresistive thin film element comprising at least one antiferromagnetic layer, a pinned magnetic layer in contact with the antiferromagnetic layer, the magnetization direction of the pinned magnetic layer being fixed by an anisotropic exchange magnetic field with the antiferromagnetic layer, a nonmagnetic electrically conductive layer formed between the pinned magnetic layer and a free magnetic layer, a bias layer for orienting the magnetization of the free magnetic layer to a direction intersecting the magnetization direction of the pinned magnetic layer, and an electrically conductive layer for supplying a sensing current to the pinned magnetic layer, the nonmagnetic electrically conductive layer and the free magnetic layer. The free magnetic layer includes a layered structure of a NiFe alloy film and a metallic cobalt or cobalt alloy film and has a thickness in a range of 30 to 100 angstrom. The ratio of the thickness of the metallic cobalt or cobalt alloy film to the thickness of the free magnetic layer is in a range of 0 to 0.5.

Preferably, the thickness of the metallic cobalt or cobalt alloy film is in a range of 0 to 40 Å.

Preferably, the metallic cobalt or cobalt alloy film is formed so as to come into contact with the nonmagnetic electrically conductive layer.

In another embodiment, the antiferromagnetic layer may be formed above the free magnetic layer, and the NiFe alloy film, as the constituent of the free magnetic layer, has a Ni content in a range of preferably 82 to 85 atomic percent, and more preferably 83 to 84 atomic percent.

In another embodiment, the antiferromagnetic layer may be formed below the free magnetic layer, and the NiFe alloy film, as the constituent of the free magnetic layer, has a Ni content in a range of preferably 80 to 83 atomic percent and more preferably 81 to 82 atomic percent.

In another embodiment, two antiferromagnetic layers may be formed, one above and one below the free magnetic layer, and the NiFe alloy film, as the constituent of the free magnetic layer, has a Ni content in a range of preferably 81 to 83.7 atomic percent and more preferably 81.7 to 82.8 atomic percent.

Also, in these embodiments, the magnetostriction constant of the free magnetic layer can be controlled to be $-2\times10^{-6}$ to $1\times10^{-6}$, and more preferably $-0.5\times10^{-6}$ to 0.

In the present invention, the antiferromagnetic layer is preferably formed of a PtMn alloy film.

Alternatively, the antiferromagnetic layer may be formed of an alloy selected from an X—Mn alloy wherein X is at least one element selected from the group consisting of Pd, Ru, Ir, Os, and Rh, and an Pt—Mn—X alloy wherein X is at least one element selected from the group consisting of Ni, Pd, Rh, Ru, Ir, Os, Cr, and Co.

DESCRIPTION OF THE PREFERRED EMBODIMENTS

Figure 1:
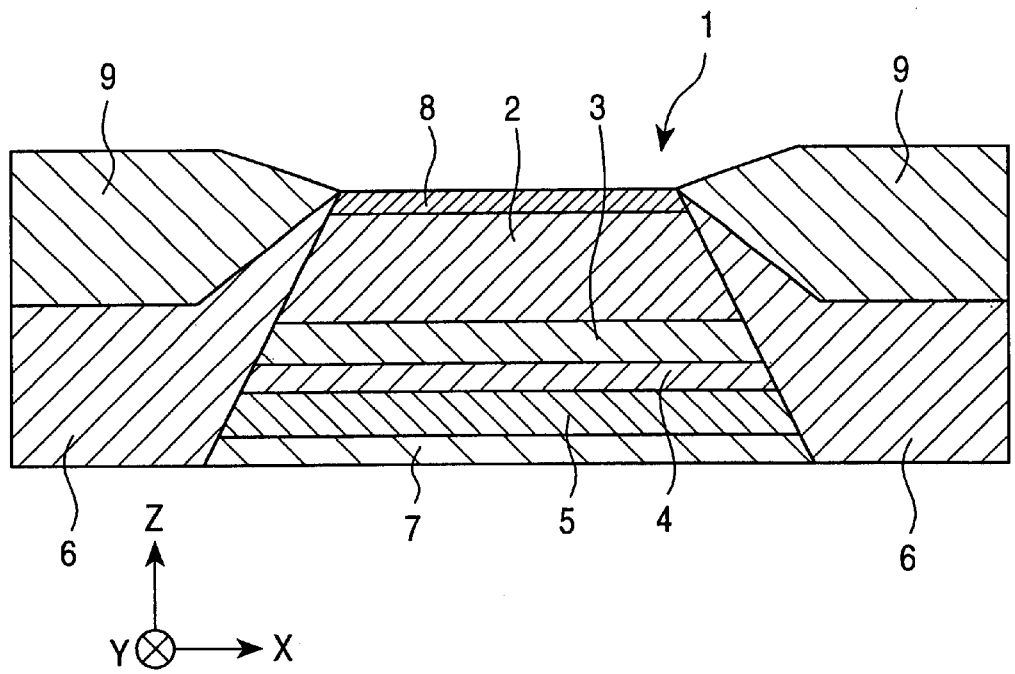
FIG. 1 is a cross-sectional view in the vicinity of an air bearing surface (ABS) of a spin-valve type magnetoresistive thin film element in a first embodiment of the present invention.
Figure 2:
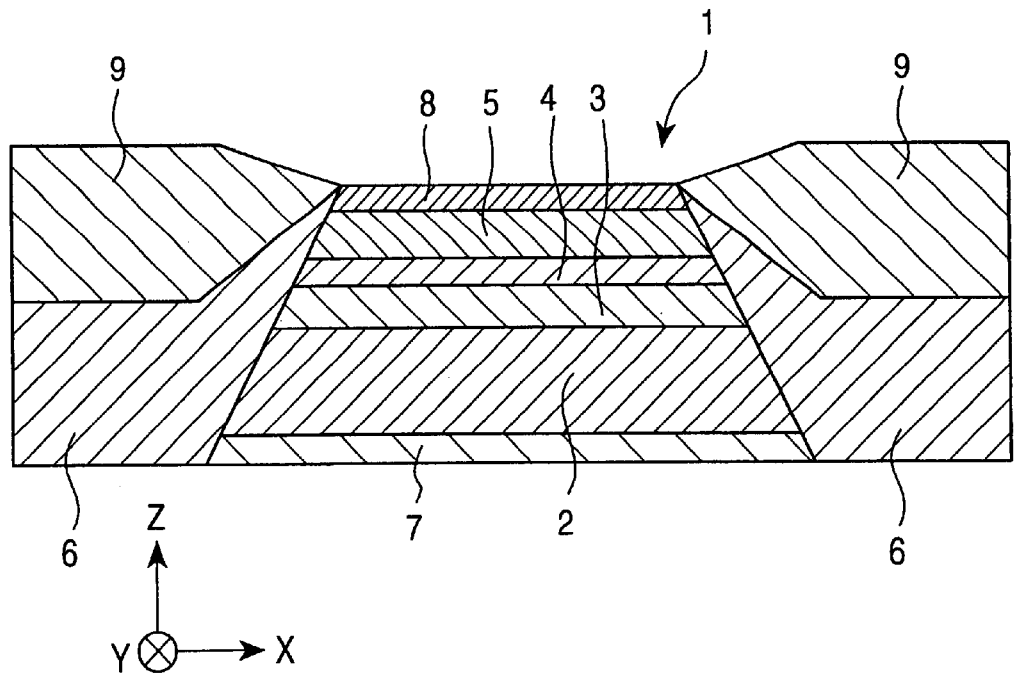
FIG. 2 is a cross-sectional view in the vicinity of an ABS of a spin-valve type magnetoresistive thin film element in a second embodiment of the present invention.
Figure 3:
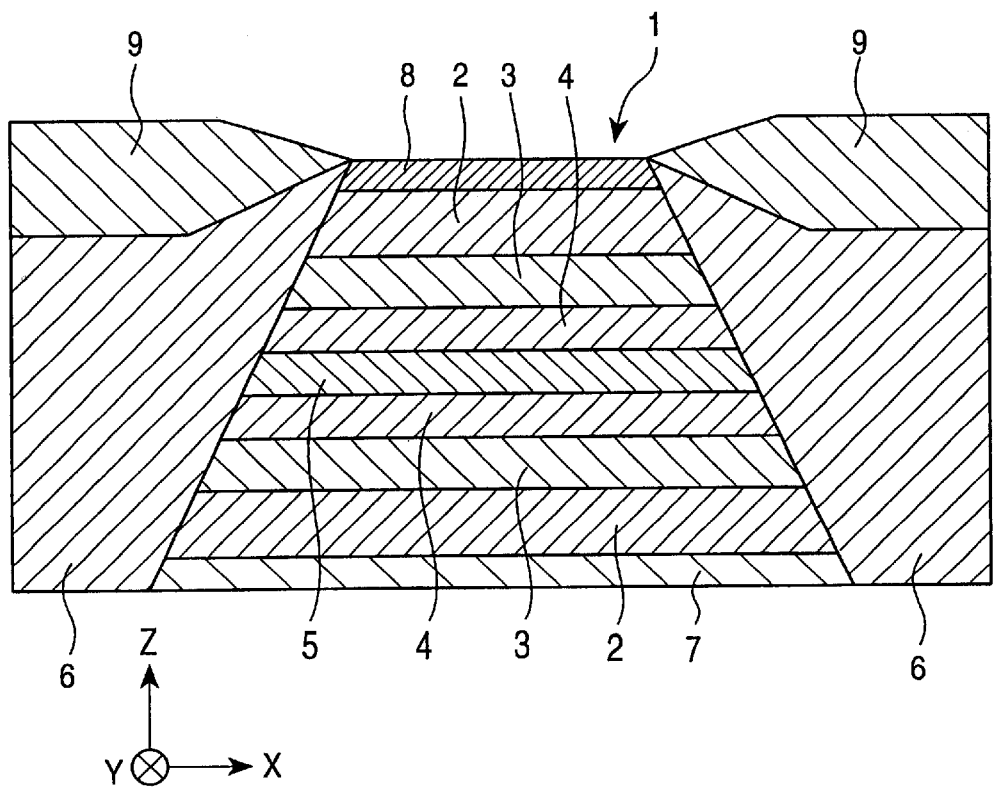
FIG. 3 is a cross-sectional view in the vicinity of an ABS of a spin-valve type magnetoresistive thin film element in a third embodiment of the present invention.

FIGS. 1 to 3 are cross-sectional views in the vicinity of air bearing surfaces (ABSs) of spin-valve type magnetoresistive thin film elements (spin-valve type magnetoresistive thin film magnetic heads) in a first embodiment, a second embodiment, and a third embodiment, respectively, of the present invention, for sensing recorded magnetic fields from recording media, such as hard disks.

In a spin-valve type magnetoresistive thin film element 1 shown in each of FIGS. 1 to 3, the top face, the bottom face, and a side face (height face) substantially orthogonal to the Y-axis are covered with an insulating film or gap film composed of, for example, $Al_2O_3$. Another side face at the ABS (front face) remote from the height face is exposed. A tensile stress is applied in the central region of a free magnetic layer 5 of the spin-valve type magnetoresistive thin film element 1 in the Y-axis direction (height direction), whereas a compressive stress is applied in two end regions of the free magnetic layer 5 in the Y-axis direction (height direction).

In FIGS. 1 to 3, an underlying layer 7 composed of a nonmagnetic material such as tantalum is formed at the bottom.

In FIG. 1, the free magnetic layer 5, a nonmagnetic electrically conductive layer 4, a pinned magnetic layer 3, and an antiferromagnetic layer 2 are deposited on the underlying layer 7, in that order.

In FIG. 2, the antiferromagnetic layer 2, the pinned magnetic layer 3, the nonmagnetic electrically conductive layer 4, and the free magnetic layer 5 are deposited on the underlying layer 7, in that order.

In FIG. 3, a pair of nonmagnetic electrically conductive layers 4, a pair of pinned magnetic layers 3, and a pair of antiferromagnetic layers 2 are formed on the top and bottom surfaces of the free magnetic layer 5, in that order, to form a dual spin-valve type magnetoresistive thin film element 1

The top layer in FIGS. 1 to 3 is a protective layer 8 composed of a nonmagnetic material such as tantalum.

In FIGS. 1 and 2, the composite layer including six layers from the underlying layer 7 to the protective layer 8 has tilted side faces. In FIG. 3, the composite layer including nine layers from the underlying layer 7 to the protective layer 8 also has tilted side faces. Hard magnetic bias layers 6 and 6 and electrically conductive layers 9 and 9 are formed on these side faces.

Constitutive materials of these layers will now be described.

The antiferromagnetic layer 2 is composed of a PtMn (platinum-manganese) alloy. The PtMn film has high corrosion resistance and a high blocking temperature compared to FeMn alloys and NiMn alloys.

The use of the PtMn alloy in the antiferromagnetic layer 2, as shown in FIG. 1, causes generation of an anisotropic exchange magnetic field at the interface with the pinned magnetic layer 3, whether the antiferromagnetic layer 2 is formed above the pinned magnetic layer 3, as shown in FIG. 1, or below the pinned magnetic layer 3, as shown in FIG. 2.

Thus, the PtMn alloy is an antiferromagnetic material which is most suitable for the dual spin-valve type magnetoresistive thin film element 1 having antiferromagnetic layers 2 above and below the pinned magnetic layer 3, as shown in FIG. 3.

The PtMn alloy has additional advantages as the antiferromagnetic material, including high heat resistance and a large anisotropic exchange magnetic field (Hex).

In the present invention, the PtMn alloy can be replaced with an X—Mn alloy wherein X is at least one element selected from the group consisting of Pd, Ru, Ir, Os, and Rh, or a Pt—Mn—X alloy wherein X is at least one element selected from the group consisting of Ni, Pd, Rh, Ru, Ir, Os, Cr, and Co. Preferably, the ratio of the components in the PtMn alloy lies in a range of Pt:Mn=1:9 to 3:7 or 1:0.7 to 1:1.3, and more preferably 1:1. Also, the ratio of the components in the X—Mn alloy preferably lies in a range of X:Mn=1:9 to 3:7 or 1:0.7 to 1:1.3, and more preferably 1:1.

The pinned magnetic layer 3 of the present invention is composed of a nickel-iron (NiFe) alloy, a cobalt (Co) alloy, or metallic cobalt. The free magnetic layer 5 is composed of a NiFe alloy. The nonmagnetic electrically conductive layer 4 is composed of copper. The hard magnetic bias layers 6 and 6 may be composed of, for example, a cobalt-platinum (Co—Pt) alloy or a cobalt-chromium-platinum (Co—Cr—Pt) alloy. The electrically conductive layer 8 is composed of chromium or tungsten.

As shown in FIGS. 1 to 3, the pinned magnetic layer 3 comes into contact with the antiferromagnetic layer 2. When the pinned magnetic layer 3 is annealed in a magnetic field applied in the Y-axis direction (height direction or the direction of a fringing magnetic field from the recording medium), an anisotropic exchange magnetic field is formed at the interface between the pinned magnetic layer 3 and the antiferromagnetic layer 2, and the magnetization of the pinned magnetic layer 3 is pinned to generate a single-domain state in the Y-axis direction.

Since the hard magnetic bias layers 6 and 6 are magnetized in the X-axis direction in the drawing (track width direction), the magnetization of the free magnetic layer 5 is oriented in the X-axis direction by the effects of the hard magnetic bias layers 6 and 6.

In the spin-valve type magnetoresistive thin film elements shown in FIGS. 1 to 3, a stationary current as a sensing current is applied to the pinned magnetic layer 3, the nonmagnetic electrically conductive layer 4, and the free magnetic layer 5 from the electrically conductive layers 9 and 9. When a magnetic field is applied to the free magnetic layer 5 in the Y-axis direction from the recording medium, the direction of the magnetization of the free magnetic layer 5 is changed from the X-direction to the Y-direction. Electrons moving from one of the free magnetic layer 5 and the pinned magnetic layer 3 to the other are scattered at the interface between the nonmagnetic electrically conductive layer 4 and the pinned magnetic layer 3 or at the interface between the nonmagnetic electrically conductive layer 4 and the free magnetic layer 5, resulting in a change in electrical resistance. Thus, the stationary current is changed to produce a sensing output.

Figure 11:
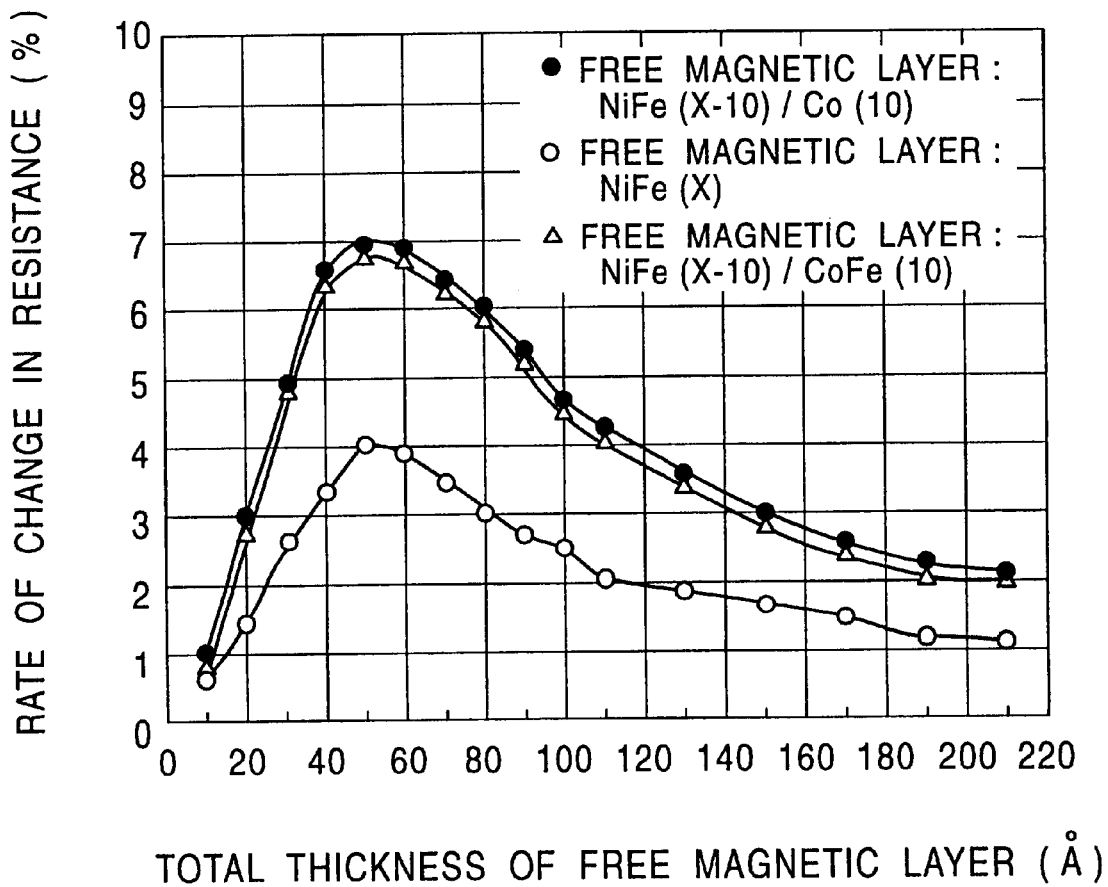
FIG. 11 is a graph showing the relationship between the thickness of the free magnetic layer and the rate of change in resistance in spin-valve films having various types of free magnetic layers.

As described above, the free magnetic layer 5 shown in FIGS. 1 to 3 is composed of a NiFe alloy. The free magnetic layer 5 preferably has a thickness in a range of 30 to 100 Å. A thickness within this range results in a high rate of change in resistance, as shown in FIG. 11 (described later), which is approximately twice the rate (approximately 2%) of the change in resistance of an anisotropic magnetoresistive (AMR) element. The ratio of the components in the NiFe alloy is preferably determined so that the magnetostriction constant of the free magnetic layer 5 is in a range of $-2\times10^{-6}$ to $1\times10^{-6}$, and more preferably $-0.5\times10^{-6}$ to 0.

When the free magnetic layer 5 has the above magnetostriction constant, the anisotropic magnetic dispersion in the free magnetic layer 5 due to the magnetoelastic effect in the height direction (Y-axis direction) is small so that Barkhausen noise can be effectively reduced.

In detail, a tensile stress is applied in the central region of the free magnetic layer 5 in the Y-axis direction (height direction), whereas a compressive stress is applied in the two end regions of the free magnetic layer 5 in the Y-axis direction (height direction), as described above. The central region of the free magnetic layer 5 away from the hard magnetic bias layer 6 is less affected by the magnetization generated in the hard magnetic bias layer 6 in the X-axis direction (track width direction). A large quantity of anisotropic magnetic dispersion in the Y-axis direction due to a large magnetoelastic effect is applied to the central region and causes inclination of the magnetization in the central region in the Y-axis direction (height direction), resulting in the generation of Barkhausen noise. Such inclination of the magnetization in the central region also causes a decreased rate of change in resistance, because the central region of the free magnetic layer 5 has the most significant spin-valve effect.

Figure 7:
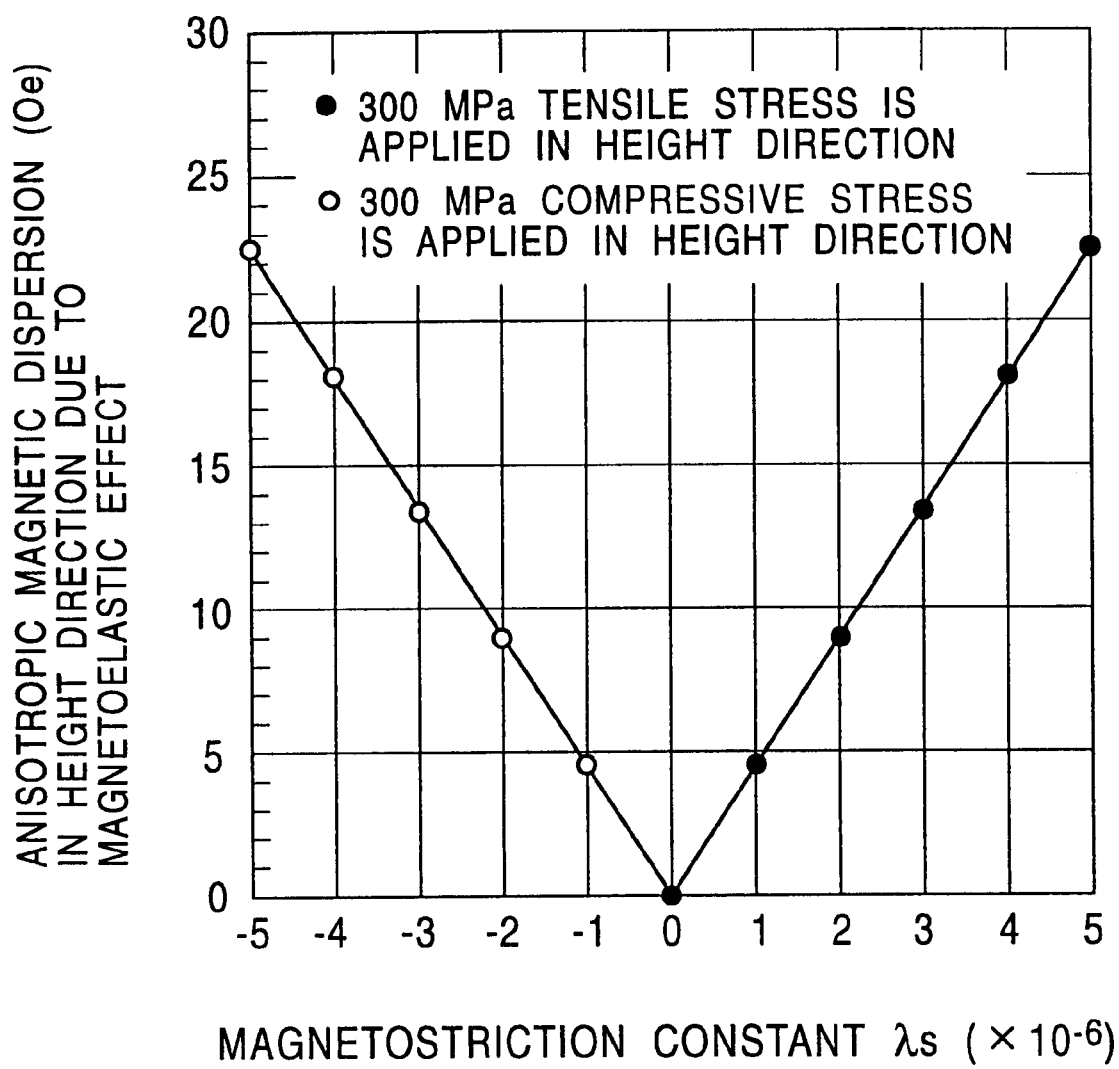
FIG. 7 is a graph showing the relationship between the magnetostriction constant $\lambda s$ of a free magnetic layer and the anisotropic magnetic dispersion in the height direction due to the magnetoelastic effect.

FIG. 7 is a graph showing the relationship between the magnetostriction constant $\lambda s$ of the free magnetic layer 5 and the anisotropic magnetic dispersion in the height direction due to the magnetoelastic effect. The anisotropic magnetic dispersion in the height direction due to magnetoresistive effect is determined by the equation, 3×(magnetostriction constant $\lambda s$ of the free magnetic layer 5)×(stress σ applied to the free magnetic layer 5)÷(saturated magnetization of the free magnetic layer 5).

As shown in FIG. 7, when the magnetostriction constant $\lambda s$ is zero, the anisotropic magnetic dispersion is zero (Oe: Oersted). When a tensile stress is applied to the free magnetic layer 5 in the height direction, the magnetostriction constant $\lambda s$ has a positive value and linearly increases as the tensile stress increases. When a compressive stress is applied to the free magnetic layer 5 in the height direction, the magnetostriction constant $\lambda s$ has a negative value and the absolute value thereof linearly increases as the compressive stress increases. The height direction becomes the easy axis of magnetization as the anisotropic magnetic dispersion in the height direction increases due to a magnetoelastic effect. Thus, the magnetization of the free magnetic layer 5 is readily directed in the height direction.

As shown in FIG. 7, when the magnetostriction constant $\lambda s$ has a large positive value, large anisotropic magnetic dispersion in the height direction due to the magnetoelastic effect is generated in the central region of the free magnetic layer 5. Thus, the magnetization in the central region is undesirably inclined in the height direction.

When the magnetostriction constant $\lambda s$ of the free magnetic layer 5 has a positive value which is nearly zero, the anisotropic magnetic dispersion in the height direction due to the magnetoelastic effect can be reduced in the central region of the free magnetic layer 5. When the magnetostriction constant $\lambda s$ has a negative value, the track width direction becomes the easy axis of magnetization in the central region of the free magnetic layer 5. Thus, the magnetization in the central region can be oriented in the track width direction.

When the free magnetic layer 5 has a large negative magnetostriction constant $\lambda s$, anisotropic magnetic dispersion in the height direction due to the magnetoelastic effect significantly increases in two end regions of the free magnetic layer 5 under a compressive stress, as shown in FIG. 7. Thus, the magnetization in these end regions tends to incline in the height direction, resulting in Barkhausen noise. Accordingly, the magnetostriction constant of the free magnetic layer 5 in the present invention is in a range of preferably $-2\times10^{-6}$ to $1\times10^{-6}$ and more preferably $-0.5\times10^{-6}$ to 0.

In a spin-valve film in which the antiferromagnetic layer 2 (a PtMn alloy film) was formed above the free magnetic layer 5 (a NiFe alloy film) (hereinafter this configuration is referred to as an upper-PtMn configuration), the relationship between the thickness of the NiFe alloy and the magnetostriction constant $\lambda s$ will be described. The spin-valve thin film having the upper-PtMn configuration included, from the bottom, a silicon substrate, an alumina layer, an underlying layer (50 Å) composed of tantalum, a free magnetic layer 5 composed of NiFe (variable thickness), a nonmagnetic electrically conductive layer composed of copper (30 Å), an antiferromagnetic layer composed of PtMn (300 Å), and a protective layer composed of tantalum (50 Å). Each figure in parentheses represents the thickness of the layer. The nickel content in the NiFe alloy used in the free magnetic layer 5 was 83 atomic percent. In an actual spin-valve thin film, a pinned magnetic layer was formed between the copper nonmagnetic electrically conductive layer and the PtMn antiferromagnetic layer. The anisotropic exchange magnetic field generated at the boundary between the pinned magnetic layer and the antiferromagnetic layer affected the measurement of the magnetostriction constant of the free magnetic layer 5. Thus, the pinned magnetic layer was omitted in order to achieve measurement of a correct magnetostriction constant.

The relationship between the thickness of the NiFe alloy film and the magnetostriction constant $\lambda s$ was determined immediately after the formation of the spin-valve film (not annealed). In addition, the spin-valve film was annealed at 250° C. for 4 hours, and was heat-treated four times at 250° C. for one hour to thermally cure a resist layer provided in an inductive writing head. The relationship between the thickness of the annealed NiFe alloy film and the magnetostriction constant $\lambda s$ was also determined. The results are shown in FIG. 8.

Figure 8:
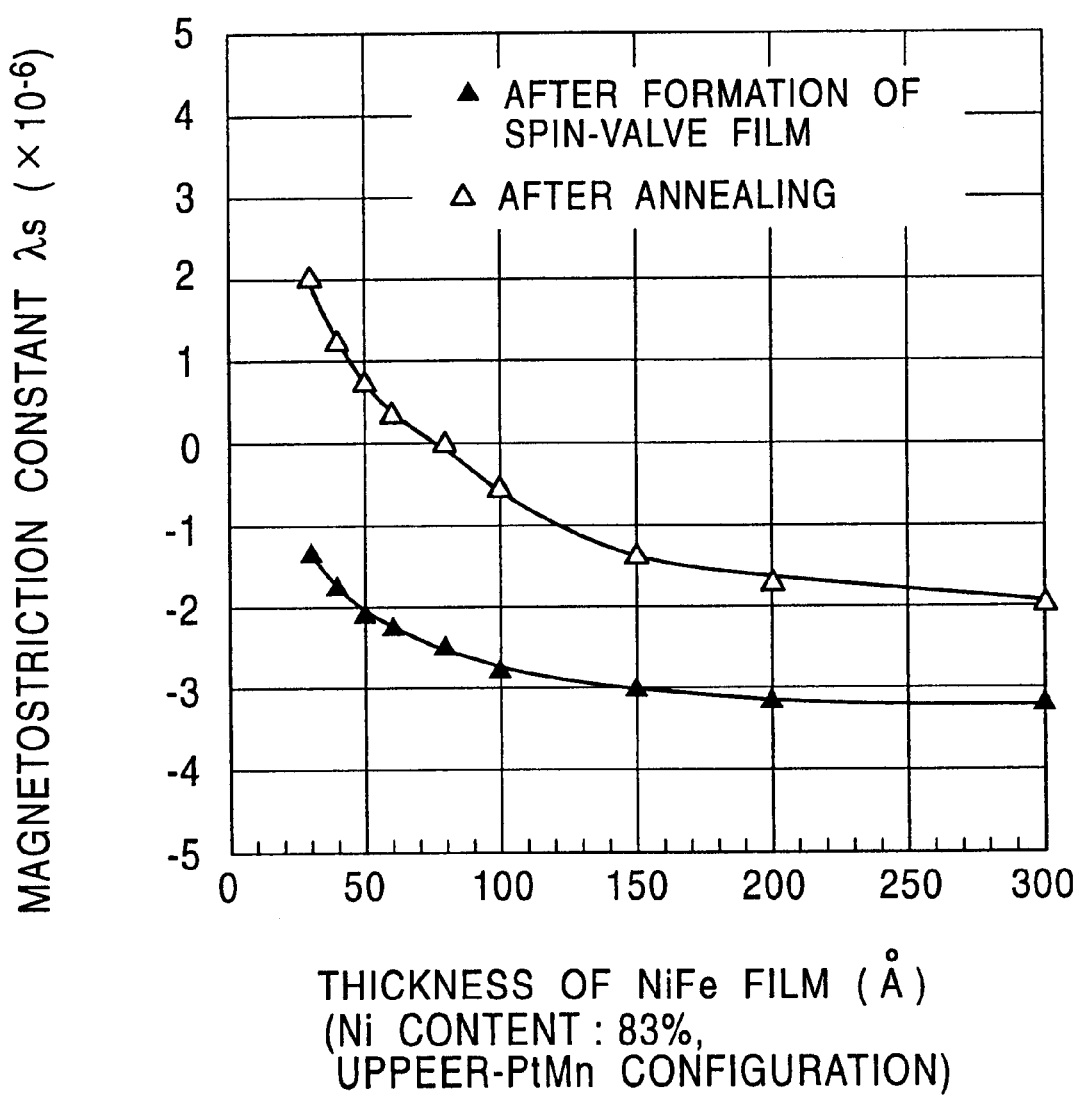
FIG. 8 is a graph showing the relationship between the thickness of the NiFe alloy and the magnetostriction constant $\lambda s$ of a free magnetic layer composed of a NiFe alloy with a nickel content of 83 atomic percent, provided with an antiferromagnetic layer thereon.

As shown in FIG. 8, the magnetostriction constant of the free magnetic layer 5 was decreased and shifted to negative values as the thickness of the NiFe alloy film (free magnetic layer 5) increased. The magnetostriction constant curve was shifted to the positive side by the annealing of the spin-valve film.

FIG. 9 shows the relationship between the thickness of the Ni alloy film and the magnetostriction constant $\lambda s$ of NiFe alloy films (free magnetic layers 5) having different nickel contents of 82, 83, 84 and 85 atomic percent in which the configuration of the spin-valve film (upper-PtMn configuration) and the annealing conditions were the same as those described above As shown in FIG. 9, for all of the nickel contents, the magnetostriction constant of the NiFe alloy film was shifted to a larger negative value as the thickness of the NiFe alloy film increased. The magnetostriction constant curve was shifted to the positive side as the nickel content in the NiFe alloy decreased.

In a spin-valve film in which a PtMn-alloy antiferromagnetic layer was formed below a NiFe-alloy free magnetic layer 5 (hereinafter this configuration is referred to as a lower-PtMn configuration) and spin-valve film in which PtMn-alloy antiferromagnetic layers were formed above and below a NiF-alloy free magnetic layer 5 (hereinafter this configuration is referred to as a dual configuration), the relationship between the thickness of the NiFe alloy and the magnetostriction constant $\lambda s$ will be described. The spin-valve thin film having the lower-PtMn configuration included, from the bottom, a silicon substrate, an alumina layer, an underlying layer composed of tantalum (50 Å), an antiferromagnetic layer composed of PtMn (300 Å), a non-magnetic electrically conductive layer composed of copper (30 Å), a free magnetic layer 5 composed of NiFe (variable thickness), and a protective layer composed of tantalum (50 Å). The spin-valve thin film having the dual configuration includes, from the bottom, a silicon substrate, an alumina layer, an underlying layer composed of tantalum (50 Å), an antiferromagnetic layer composed of PtMn (300 Å), a non-magnetic electrically conductive layer composed of copper (30 Å), a free magnetic layer 5 composed of NiFe (variable thickness), a nonmagnetic electrically conductive layer composed of copper (30 Å), an antiferromagnetic layer composed of PtMn (300 Å), and a protective layer composed of tantalum (50 Å). Each figure in parentheses represents the thickness of the layer. The nickel content in the NiFe alloy used in the free magnetic layers 5 was 83.5 atomic percent.

The pinned magnetic layer was omitted in order to achieve measurement of a correct magnetostriction constant, as described above. Also, in the above configuration in which the nickel content in the NiFe alloy film was 83.5 atomic percent, the relationship between the thickness of the NiFe alloy and the magnetostriction constant $\lambda s$ will be described.

Figure 10:
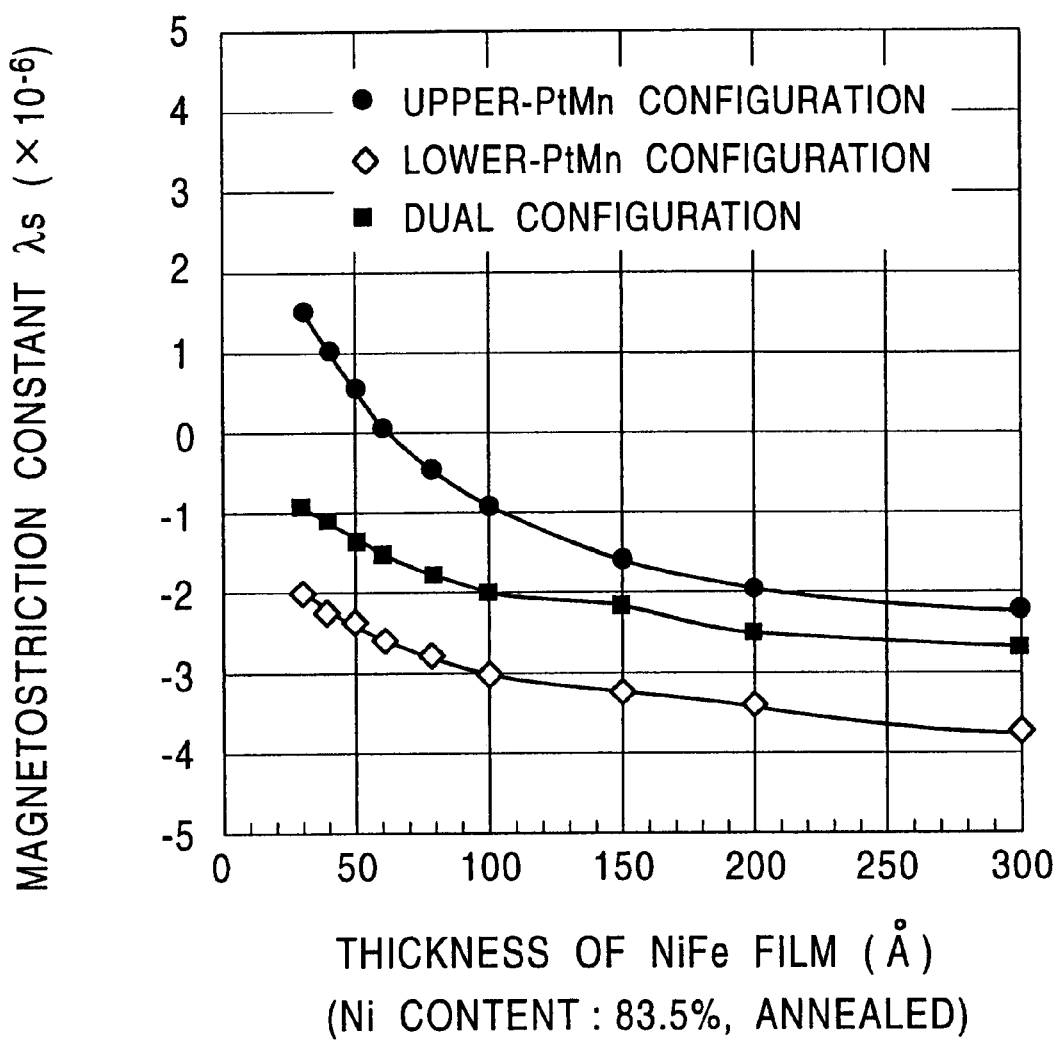
FIG. 10 is a graph showing the relationship between the magnetostriction constant $\lambda s$ and the thickness of the NiFe alloy film (nickel content: 83.5 atomic percent) in which an antiferromagnetic layer is formed above or below a NiFe free magnetic layer, or in which antiferromagnetic layers are formed above and below a NiFe free magnetic layer.

FIG. 10 is a graph showing the relationship between the thickness and the magnetostriction constant, when the spin-valve film was annealed as described above. The magnetostriction constant $\lambda s$ was shifted to a more negative value as the thickness of the NiFe alloy film increased. The shift towards the negative value was more noticeable in the dual configuration than the upper-PtMn configuration and was most noticeable in the lower-PtMn configuration.

The preferable range of the magnetostriction constant was $-2 \times 10^{-6}$ to $1 \times 10^{-6}$, and more preferably $-0.5 \times 10^{-6}$ to 0, as described above. As shown in FIG. 10, the absolute value of the magnetostriction constant was excessively large when the thickness of the NiFe free magnetic layer 5 was excessively increased.

The relationship between the thickness and the rate of change in resistance will now be described using two types of spin-valve films. The first type of spin-valve film had a configuration including, from the bottom, a silicon substrate, an alumina ($Al_2O_3$) layer, a tantalum underlying layer (50 Å), a NiFe free magnetic layer 5 (variable thickness), a copper nonmagnetic electrically conductive layer (30 Å), a cobalt pinned magnetic layer (40 Å), a PtMn antiferromagnetic layer (300 Å), and a tantalum protective layer (50 Å).

The second type of spin-valve films had a free magnetic layer 5 which was composed of a NiFe alloy film and a metallic cobalt or cobalt alloy film. One of the second-type spin-valve films had a film configuration including, from the bottom, a silicon substrate, an alumina ($Al_2O_3$) layer, a tantalum underlying layer (50 Å), a NiFe free magnetic layer 5 (variable thickness), a Co free magnetic layer 5 (10 Å), a copper nonmagnetic electrically conductive layer (24 Å), a cobalt pinned magnetic layer (40 Å), a PtMn antiferromagnetic layer (300 Å), and a tantalum protective layer (50 Å). In the other second-type spin-valve composite film, a CoFe free magnetic layer 5 (10 Å) was included instead of the Co free magnetic layer 5. The figures in parentheses represent the thickness.

FIG. 11 is a graph showing the rate of change in resistance of these spin-valve films which were annealed at 240° C. for 3 hours in a magnetic field of 2 kOe. The rate of change in resistance increased as the thickness of the free magnetic layer 5 increased, reached a maximum at a thickness of approximately 50 Å, and then gradually decreased as the thickness further increased. The increase in the rate of change in resistance when the thickness was less than 50 Å suggests that the mean free path of conductive electrons was approximately 50 Å.

FIG. 11 also shows that the free magnetic layers 5 including the NiFe alloy film and the metallic cobalt or cobalt alloy film had a larger rate of change in resistance compared to the single NiFe alloy free magnetic layer 5.

FIG. 10 and FIG. 11 show that the preferable thickness of the free magnetic layer 5 was in a range of 30 to 100 Å in the present invention. In such a thickness range, the magnetostriction constant $\lambda s$ could be controlled to be $-2 \times 10^{-6}$ to $1 \times 10^{-6}$, in the upper-PtMn configuration and the dual configuration, as shown in FIG. 10, and the rate of change in resistance was higher than 2%, as shown in FIG. 11. Since a conventional AMR element has a rate of change in resistance of approximately 2%, the spin-valve film in accordance with the present invention had a significantly high rate of change in resistance compared to the conventional AMR element.

Figure 9:
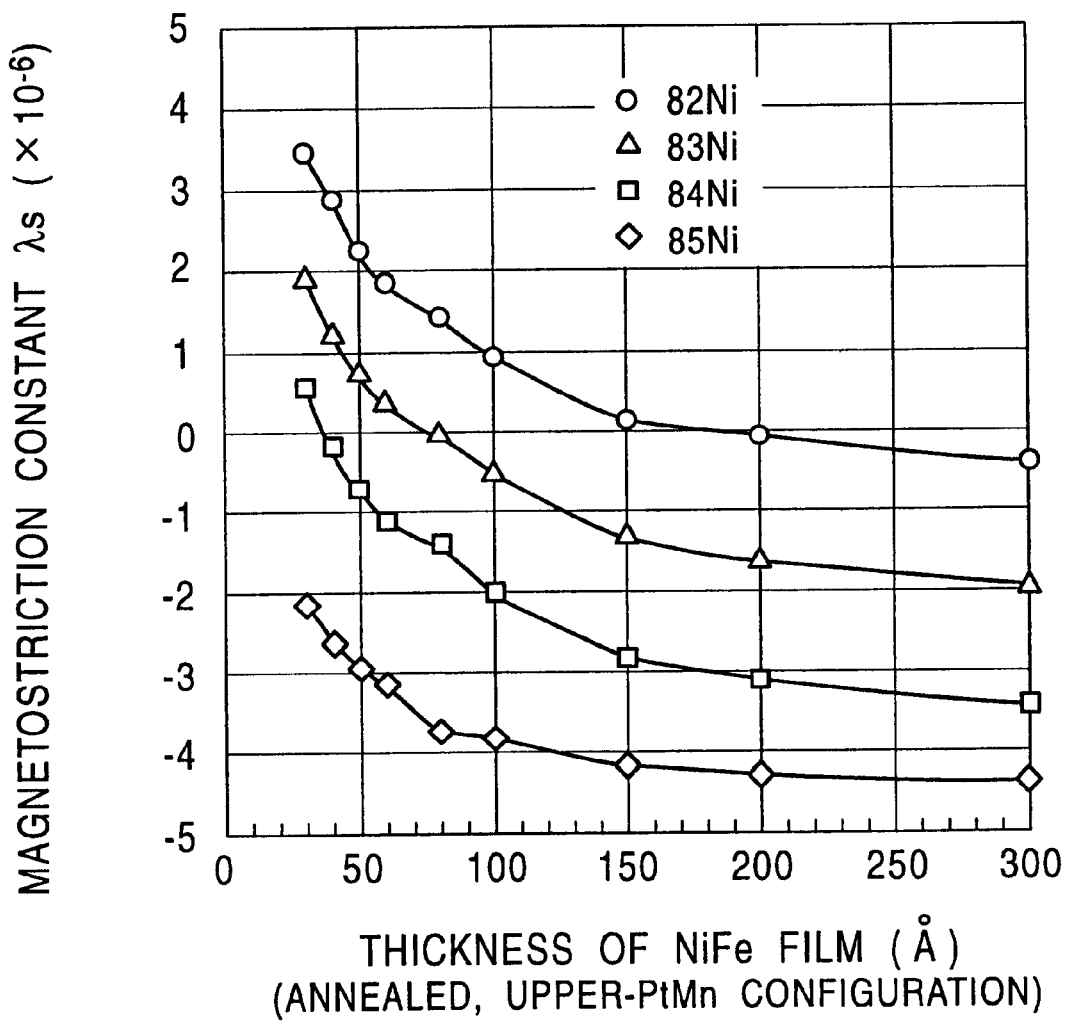
FIG. 9 is a graph showing the relationship between the magnetostriction constant $\lambda s$ and the thickness of the NiFe alloy film in which an antiferromagnetic layer is formed above a NiFe free magnetic layer and the nickel content in the NiFe free magnetic layer is varied to 82, 83, 84 and 85 atomic percent.

In the lower-PtMn configuration, however, the magnetostriction constant $\lambda s$ was lower than $-2 \times 10^{-6}$ when the thickness of the NiFe alloy film was in a range of 30 to 100 Å. As shown in FIG. 9, the magnetostriction constant $\lambda s$ could be controlled to be $-2 \times 10^{-6}$ to $1 \times 10^{-6}$ by decreasing the nickel content in the NiFe alloy film.

In the present invention, the optimum composition of the NiFe alloy for achieving a magnetostriction constant $\lambda s$ of $-2 \times 10^{-6}$ to $1 \times 10^{-6}$, and more preferably $-0.5 \times 10^{-6}$ to 0, was determined by experiments when the thickness of the NiFe free magnetic layer 5 was in a range of 30 to 100 Å. The upper-PtMn configuration, the lower-PtMn configuration, and the dual configuration were the same as those described above, and these films were annealed.

In the experiments, the relationship between the nickel content in the NiFe alloy film and the magnetostriction constant was studied when the thickness was the lower limit, that is, 30 Å, and when the thickness was the upper limit, that is, 100 Å, to determine the optimum composition for achieving a magnetostriction constant $\lambda s$ of preferably $-2 \times 10^{-6}$ to $1 \times 10^{-6}$, and more preferably $-0.5 \times^{-6}$ to 0.

Figure 12:
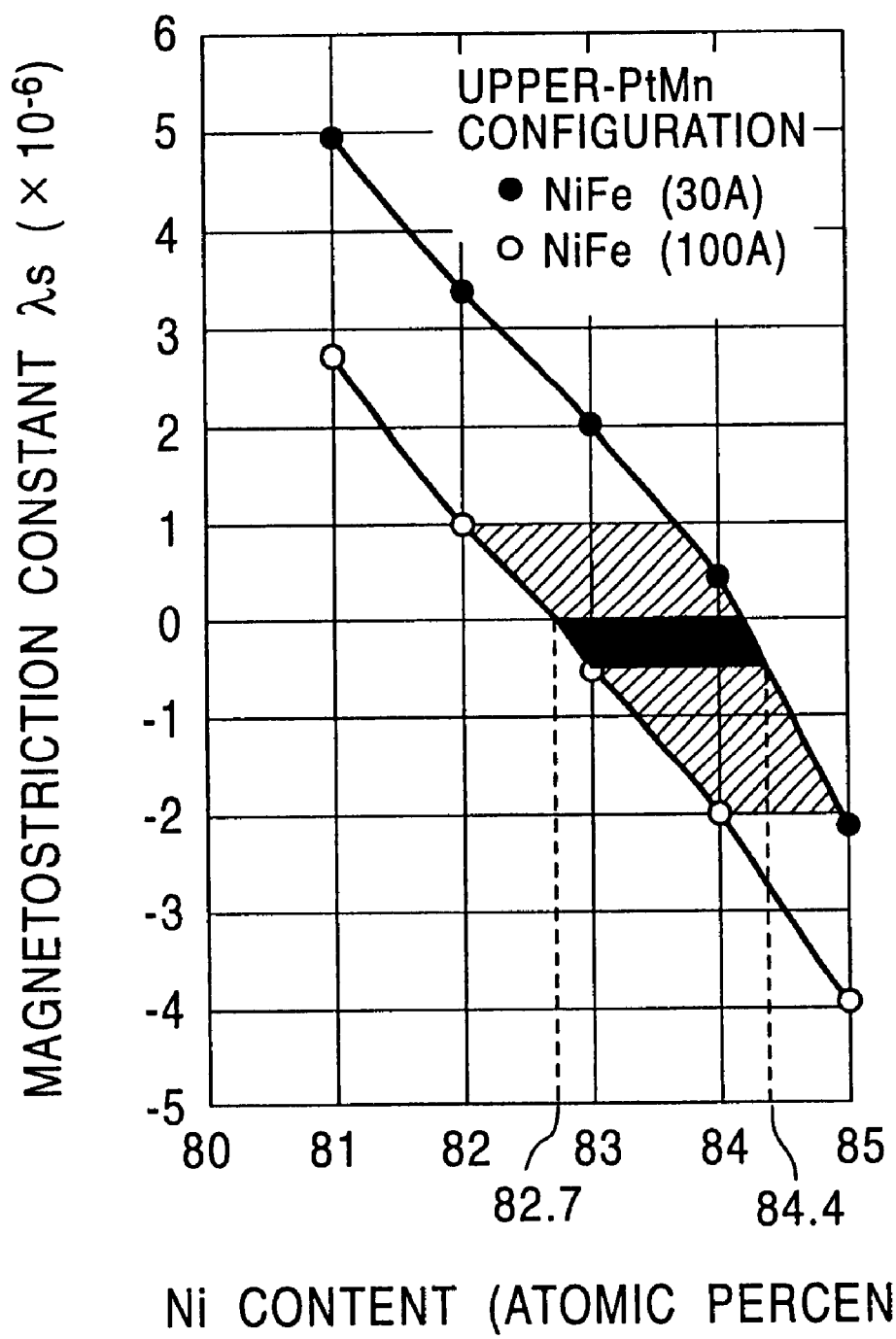
FIG. 12 is a graph showing the relationship between the Ni content of a NiFe alloy film having a thickness of 30 Å or 100 Å and the magnetostriction constant $\lambda s$ in a spin-valve film including a free magnetic layer and an antiferromagnetic layer formed above the free magnetic layer.
Figure 13:
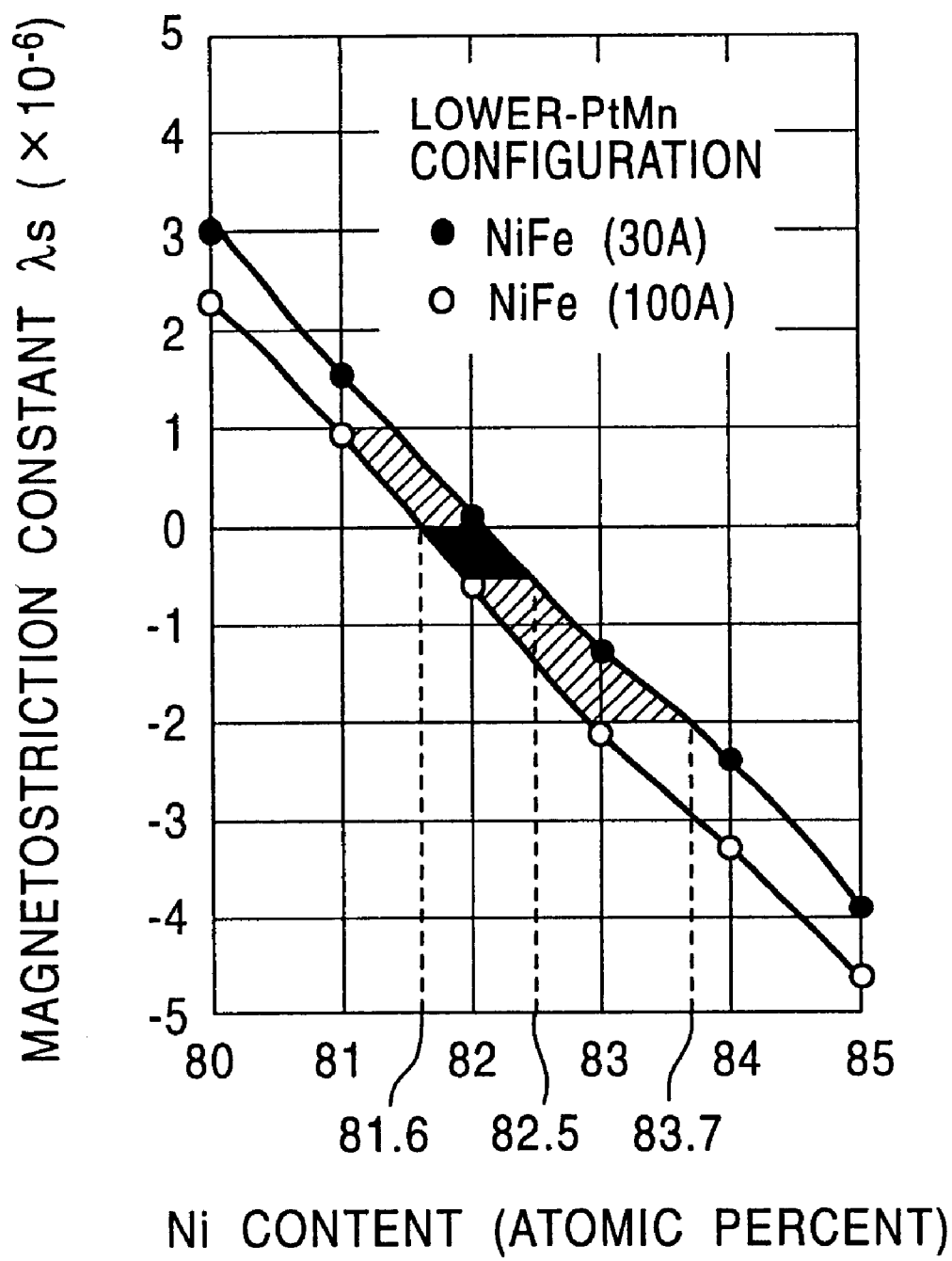
FIG. 13 is a graph showing the relationship between the Ni content of a NiFe alloy film having a thickness of 30 Å or 100 Å and the magnetostriction constant λs in a spin-valve film including a free magnetic layer and an antiferromagnetic layer formed below the free magnetic layer.

FIG. 12 shows the experimental results of the spin-valve film having the upper-PtMn configuration. FIG. 12 suggests that the magnetostriction constant of the free magnetic layer 5 could be controlled to be $-2 \times 10^{-6}$ to $1 \times 10^{-6}$ when the Ni content was within a range of 82 to 85 atomic percent. Furthermore, the magnetostriction constant of the free magnetic layer 5 could be controlled to be $-0.5 \times 10^{-6}$ to 0 when the Ni content was within a range of 82.7 to 84.4 atomic percent FIG. 13 shows the experimental results of the spin-valve film having the lower-PtMn configuration. FIG. 13 suggests that the magnetostriction constant of the free magnetic layer 5 could be controlled to be $-2 \times 10^{-6}$ to $1 \times 10^{-6}$ when the Ni content was within a range of 81.3 to 83.7 atomic percent. Furthermore, the magnetostriction constant of the free magnetic layer 5 could be controlled to be $-0.5 \times 10^{-6}$ to 0 when the Ni content was within a range of 81.6 to 82.5 atomic percent.

Figure 14:
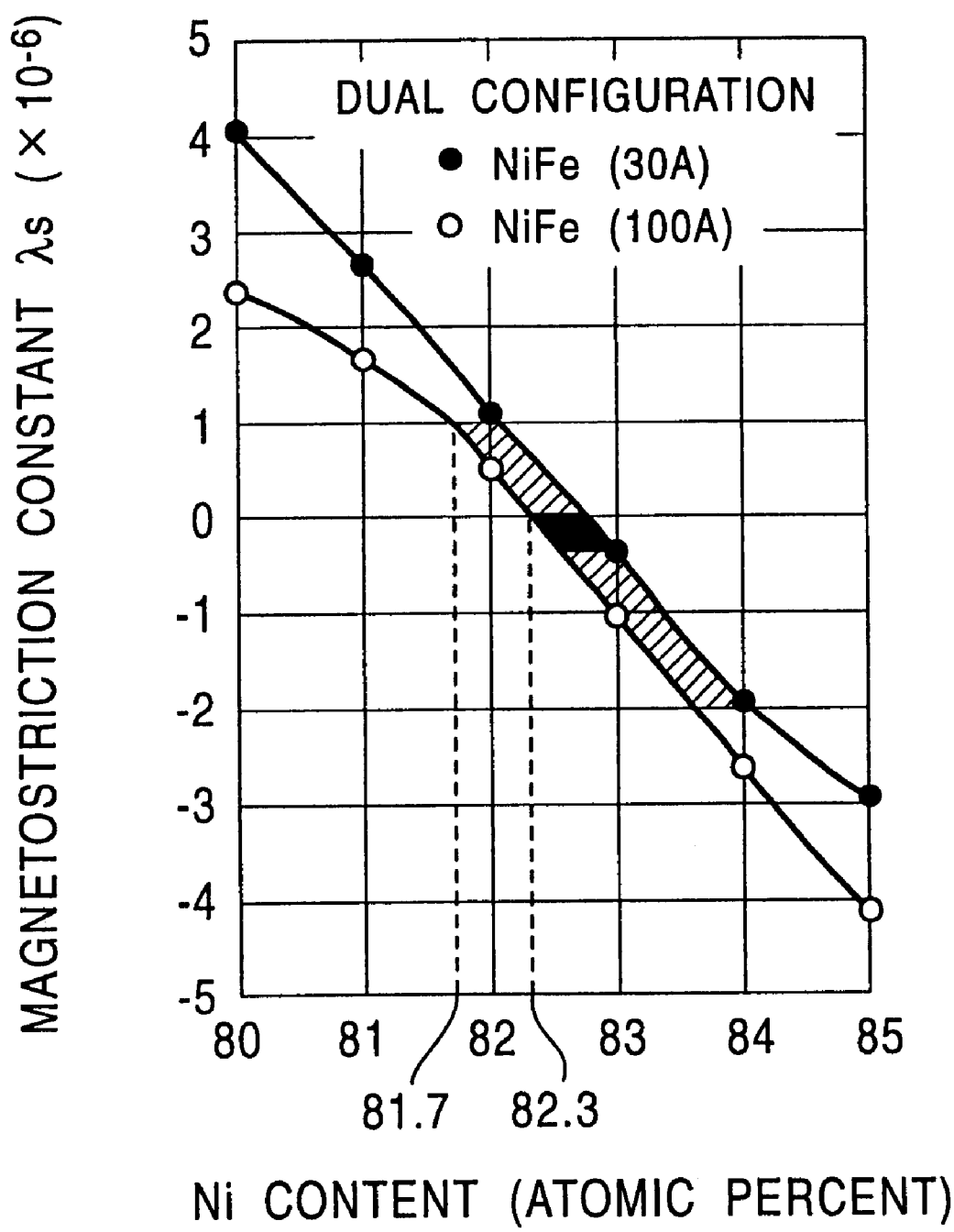
FIG. 14 is a graph showing the relationship between the Ni content of a NiFe alloy film having a thickness of 30 Å or 100 Å and the magnetostriction constant λs in a spin-valve film including a free magnetic layer and antiferromagnetic layers formed above and below the free magnetic layer.

FIG. 14 shows the experimental results of the spin-valve film having the dual configuration. FIG. 14 suggests that the magnetostriction constant of the free magnetic layer 5 could be controlled to be $-2 \times 10^{-6}$ to $1 \times 10^{-6}$ when the Ni content was within a range of 81.7 to 84 atomic percent. Furthermore, the magnetostriction constant of the free magnetic layer 5 could be controlled to be $-0.5 \times 10^{-6}$ to 0 when the Ni content was within a range of 82.3 to 83 atomic percent.

The following are reasons why the optimum nickel content in the NiFe alloy of the free magnetic layer 5 was different between the upper-PtMn configuration, the lower-PtMn configuration and the dual configuration, and why the magnetostriction constant changes with the thickness of the NiFe alloy film.

In the spin-valve film having the upper-PtMn configuration, the ferromagnetic NiFe film of the free magnetic layer 5 having magnetostriction characteristics was disposed between the nonmagnetic tantalum film (underlying layer) and the nonmagnetic copper film (nonmagnetic electrically conductive layer). In the spin-valve film having the lower-PtMn configuration, the ferromagnetic NiFe film of the free magnetic layer 5 having magnetostriction characteristics was disposed between the nonmagnetic copper film (nonmagnetic electrically conductive layer) and the nonmagnetic tantalum film (underlying layer). In the spin-valve film having the dual configuration, the ferromagnetic NiFe film of the free magnetic layer 5 having magnetostriction characteristics was disposed between the two nonmagnetic copper films.

It is generally known that the magnetostriction constant of the NiFe alloy is very sensitive to the composition of the NiFe alloy, and that the magnetostriction constant varies with the content and type of a nonmagnetic element which is added to the NiFe alloy.

In the free magnetic layer 5 of the spin-valve film, the nonmagnetic layers were formed above and/or below the NiFe alloy film having a thickness of several tens of atomic layers. In such a configuration, nonmagnetic atoms such as tantalum and copper come into direct contact with ferromagnetic atoms such as nickel and iron in the NiFe alloy film. The magnetostriction constant of the ferromagnetic atoms in direct contact with the nonmagnetic atoms varied. The change in magnetostriction constant was different between the types of the nonmagnetic film, that is, between the tantalum film and the copper film. Accordingly, the optimum composition in the NiFe alloy of the free magnetic layer 5 was different between the configurations of the spin-valve films.

When the spin-valve film was annealed, a thermal diffusion layer was formed at the interface between the NiFe free magnetic layer 5 and the nonmagnetic film such as tantalum or copper to facilitate the contact of ferromagnetic atoms in the NiFe alloy film with nonmagnetic atoms. The thickness of the thermal diffusion layer depended on the annealing temperature, the annealing time, the type of the nonmagnetic film, and the position (upper or lower) of the nonmagnetic layer, but did not depend on the thickness of the NiFe alloy film. As the thickness of the NiFe alloy film decreased, the rate of the thermal diffusion layer in the NiFe alloy film increased. Thus, the magnetostriction constant was greatly affected by the thermal diffusion layer as the thickness of the NiFe alloy film decreased. Accordingly, the magnetostriction constant varied with the thickness of the NiFe alloy film and the annealing.

Since the nonmagnetic materials disposed on the two faces of the NiFe alloy film were different between the configurations of the spin-valve films, the optimum compositions of the NiFe alloy for achieving the required magnetostriction constant were also different. In addition, the degree of mismatch or commensurate degree of the crystal lattices at the interface was different between the configurations of the spin-valve films, that is, the orders of the layers even if the same nonmagnetic materials were used. Thus, the number and state of the ferromagnetic atoms in direct contact with the nonmagnetic atoms was different between these configurations. Furthermore, the thermal diffusion coefficient at the interface was different between these configurations. Accordingly, the optimum composition in the NiFe alloy of the free magnetic layer 5 for achieving the required magnetostriction constant was different between the configurations of the spin-valve film.

In a layered configuration including a NiFe alloy free magnetic layer 5 and a CoFe alloy film as a Co-based alloy and having a total thickness of the free magnetic layer 5 of 80 Å, the relationship between the thickness of the CoFe alloy film and the magnetostriction constant $\lambda s$ will now be described.

A spin-valve thin film having an upper-PtMn configuration used for measurement of the magnetostriction constant included, from the bottom, a silicon substrate, an alumina ($Al_2O_3$) layer, a tantalum underlying layer (50 Å), a NiFe free magnetic layer 5 (80-X Å), a CoFe free magnetic layer 5 (X Å), a copper nonmagnetic electrically conductive layer (30 Å), a PtMn antiferromagnetic layer (300 Å), and a tantalum protective layer (50 Å).

A spin-valve thin film having a lower-PtMn configuration included, from the bottom, a silicon substrate, an alumina ($Al_2O_3$) layer, a tantalum underlying layer (50 Å), a PtMn antiferromagnetic layer (300 Å), a copper nonmagnetic electrically conductive layer (30 Å), a CoFe free magnetic layer 5 (X Å), a NiFe free magnetic layer 5 (80-X Å), and a tantalum protective layer (50 Å).

A spin-valve thin film having a dual configuration included, from the bottom, a silicon substrate, an alumina ($Al_2O_3$) layer, a tantalum underlying layer (50 Å), a PtMn antiferromagnetic layer (300 Å), a copper nonmagnetic electrically conductive layer (30 Å), a CoFe free magnetic layer 5 (X/2 Å), a NiFe free magnetic layer 5 (80-X Å), a CoFe free magnetic layer 5 (X/2 Å), a copper nonmagnetic electrically conductive layer (30 Å), a PtMn antiferromagnetic layer (300 Å), and a tantalum protective layer (50 Å).

Each figure in parentheses represents the thickness of the layer. The nickel content in the NiFe alloy used in the free magnetic layers 5 was 83.5 atomic percent. The cobalt content in the CoFe alloy used in the free magnetic layers 5 was 90 atomic percent. The pinned magnetic layer was omitted in order to achieve measurement of a correct magnetostriction constant, as in FIG. 8. Each spin-valve film was annealed as in FIG. 8.

Figure 15:
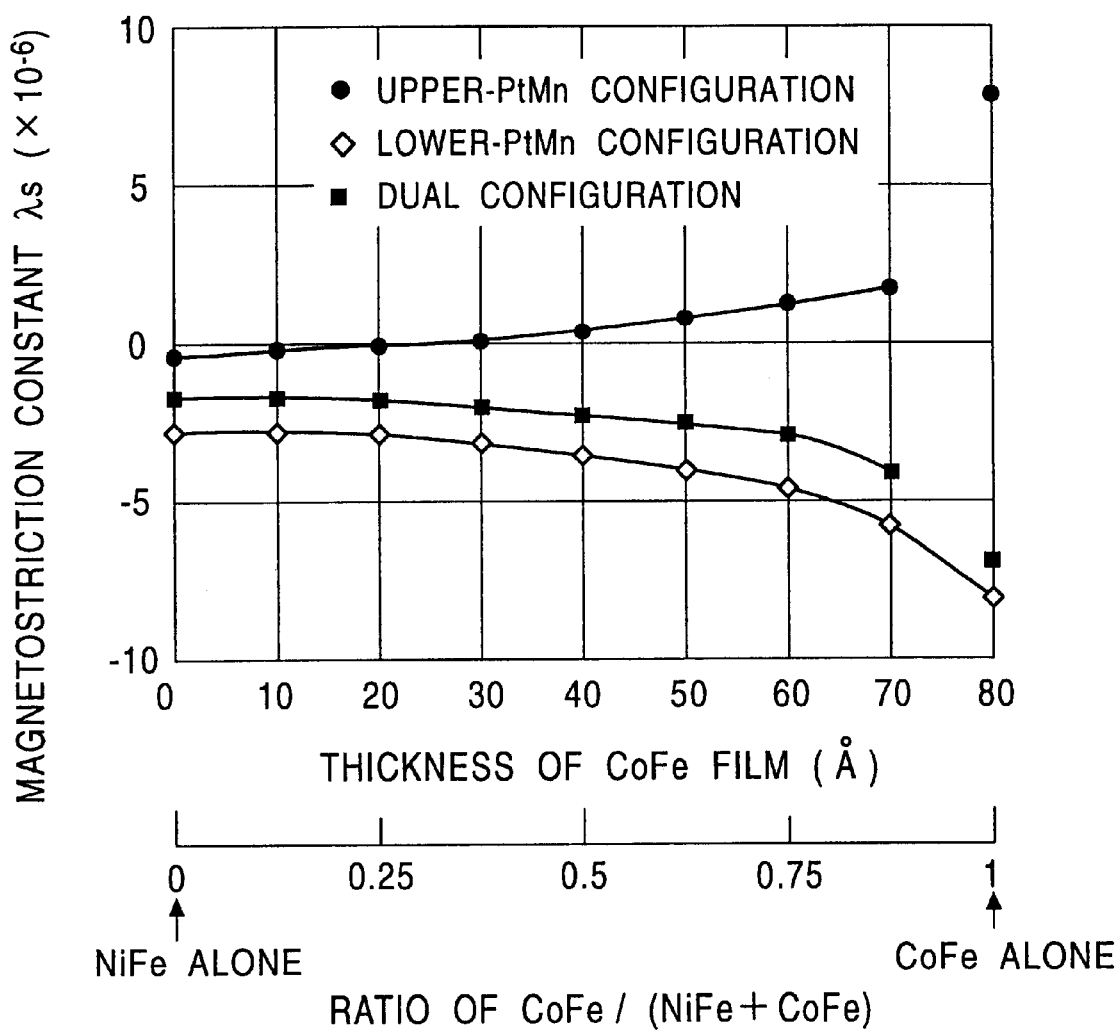
FIG. 15 is a graph showing the relationship between the thickness of a CoFe alloy film and the magnetostriction constant λs in a spin-valve film including a free magnetic layer and at least one antiferromagnetic layer formed above and/or below the free magnetic layer in which the free magnetic layer includes a NiFe alloy film and the CoFe alloy film and the total thickness of the free magnetic layer is 80 Å.

The total thickness of the free magnetic layers 5 was fixed to 80 Å, while the thickness of the CoFe alloy film was changed from 0 to 80 Å. FIG. 15 shows the relationship between the thickness of the CoFe alloy film and the magnetostriction constant.

As shown in FIG. 15, in the spin-valve film having the lower-PtMn configuration and the spin-valve film having the dual configuration, the magnetostriction constant $\lambda s$ of the free magnetic layer 5 shifted to the negative side as the thickness of the CoFe alloy film increased (as the thickness of the NiFe alloy film decreased). In contrast, in the spin-valve film having the upper-PtMn configuration, the magnetostriction constant $\lambda s$ of the free magnetic layer 5 shifted to the positive side as the thickness of the CoFe alloy film increased (as the thickness of the NiFe alloy film decreased).

When the thickness of the CoFe alloy film was 40 Å or more, the magnetostriction constant $\lambda s$ of the free magnetic layer 5 in the lower-PtMn or dual configuration was significantly different from the magnetostriction constant $\lambda s$ of the free magnetic layer 5 in the upper-PtMn configuration and the absolute value of the magnetostriction constant $\lambda s$ in each configuration was large. In the present invention, therefore, the ratio of the thickness of the CoFe alloy film to the total thickness of the free magnetic layer 5 was set to be 0 to 0.5 when the total thickness of the free magnetic layer 5 was 30 to 100 Å. Such a ratio can decrease the absolute value of the magnetostriction constant $\lambda s$.

FIG. 15 further suggests that the preferable ratio of the thickness of the CoFe alloy film to the total thickness of the free magnetic layer 5 is in a range of 0 to 0.5 and that the preferable thickness of the CoFe alloy film is in a range of 0 to 40 Å.

The magnetostriction constant $\lambda s$ could be shifted to the positive or negative side by changing the Ni content in the NiFe alloy, as shown in FIG. 9. Thus, in the present invention, the composition of the NiFe alloy for achieving the magnetostriction constant $\lambda s$ of the free magnetic layer 5 in a range of $-2 \times 10^{-6}$ to $1 \times 10^{-6}$, and more preferably $-0.5 \times 10^{-6}$ to 0, was determined from the relationship between the Ni content of the NiFe alloy and the magnetostriction constant in which the thickness of the NiFe alloy film as the free magnetic layer 5 was 80 Å or the thickness of each of the NiFe alloy film and the CoFe alloy film as the free magnetic layer 5 was 40 Å.

The configurations of the spin-valve films used in the experiment were the same as those in FIG. 14, and these spin-valve films were annealed.

Figure 16:
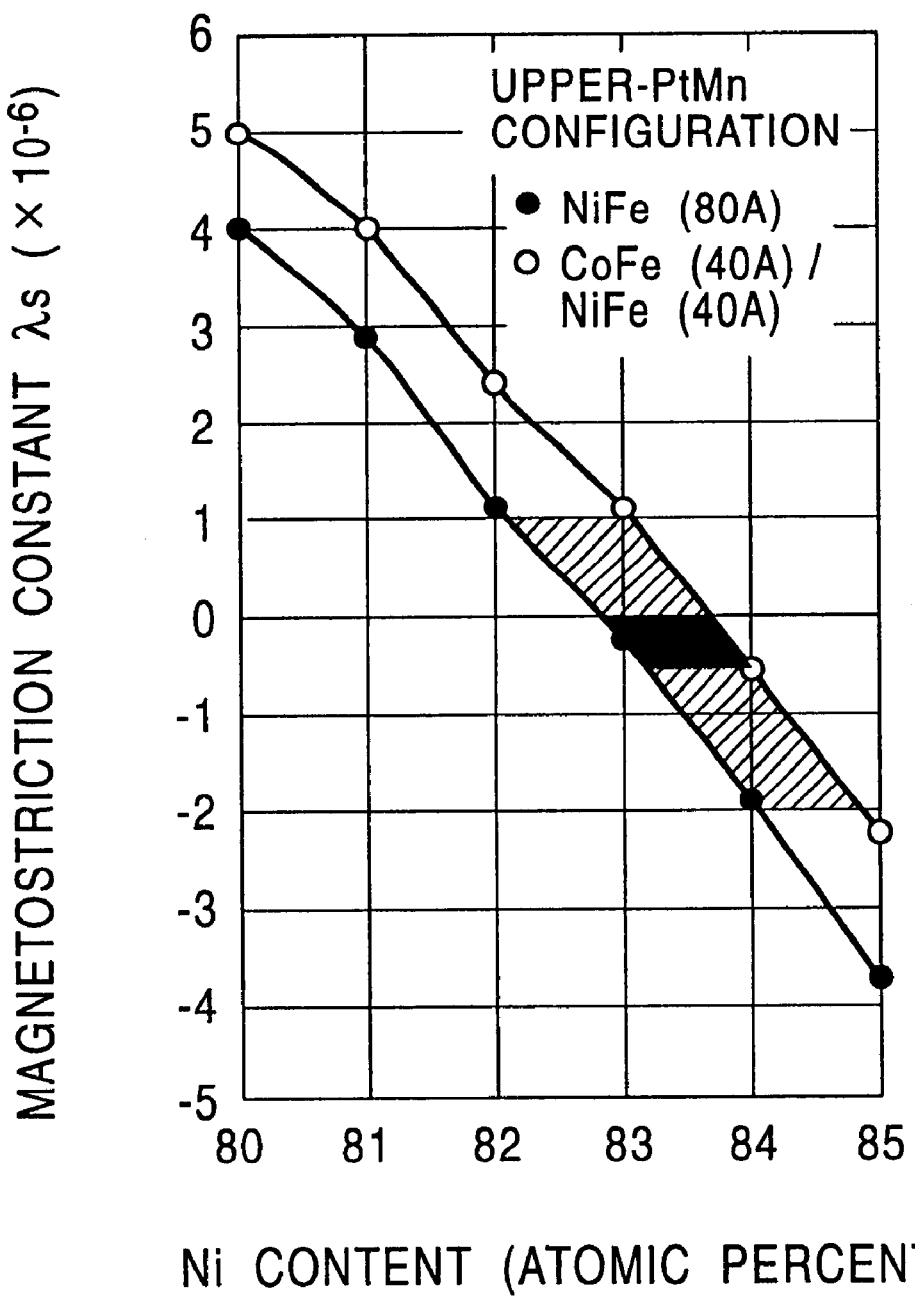
FIG. 16 is a graph showing the relationship between the nickel content in the NiFe alloy and the magnetostriction constant λs in a spin-valve film including a free magnetic layer and an antiferromagnetic layer formed above the free magnetic layer, in which the free magnetic layer includes a NiFe alloy film having a thickness of 80 Å, or includes a NiFe alloy film having a thickness of 40 Å and a CoFe alloy film having a thickness of 40 Å.

FIG. 16 is a graph the relationship between the nickel content in the NiFe alloy and the magnetostriction constant $\lambda s$ in the spin-valve film having the upper-PtMn configuration. FIG. 16 shows that the magnetostriction constant $\lambda s$ of the free magnetic layer 5 could be controlled to be $-2 \times 10^{-6}$ to $1 \times 10^{-6}$ when the nickel content was in a range of 82 to 85 atomic percent, and to be $-0.5 \times 10^{-6}$ to 0 when the nickel content was in a range of 83 to 84 atomic percent.

Figure 17:
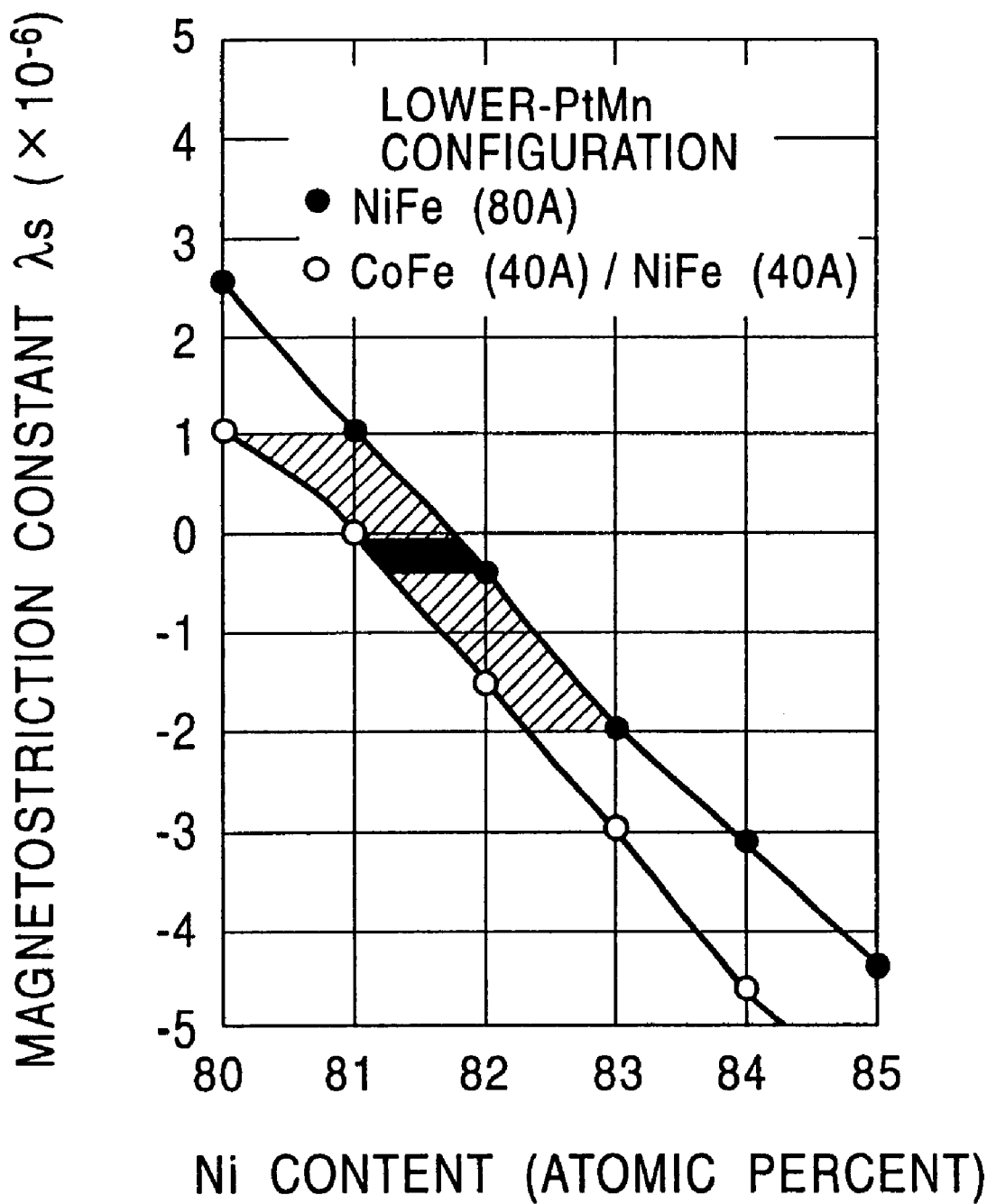
FIG. 17 is a graph showing the relationship between the nickel content in the NiFe alloy and the magnetostriction constant λs in a spin-valve film including a free magnetic layer and an antiferromagnetic layer formed below the free magnetic layer, in which the free magnetic layer includes a NiFe alloy film having a thickness of 80 Å, or includes a NiFe alloy film having a thickness of 40 Å and a CoFe alloy film having a thickness of 40 Å.

FIG. 17 is a graph the relationship between the nickel content in the NiFe alloy and the magnetostriction constant $\lambda s$ in the spin-valve film having the lower-PtMn configuration. FIG. 17 shows that the magnetostriction constant $\lambda s$ of the free magnetic layer 5 could be controlled to be $-2 \times 10^{-6}$ to $1 \times 10^{-6}$ when the nickel content was in a range of 80 to 83 atomic percent, and to be $-0.5 \times 10^{-6}$ to 0 when the nickel content was in a range of 81 to 82 atomic percent.

Figure 18:
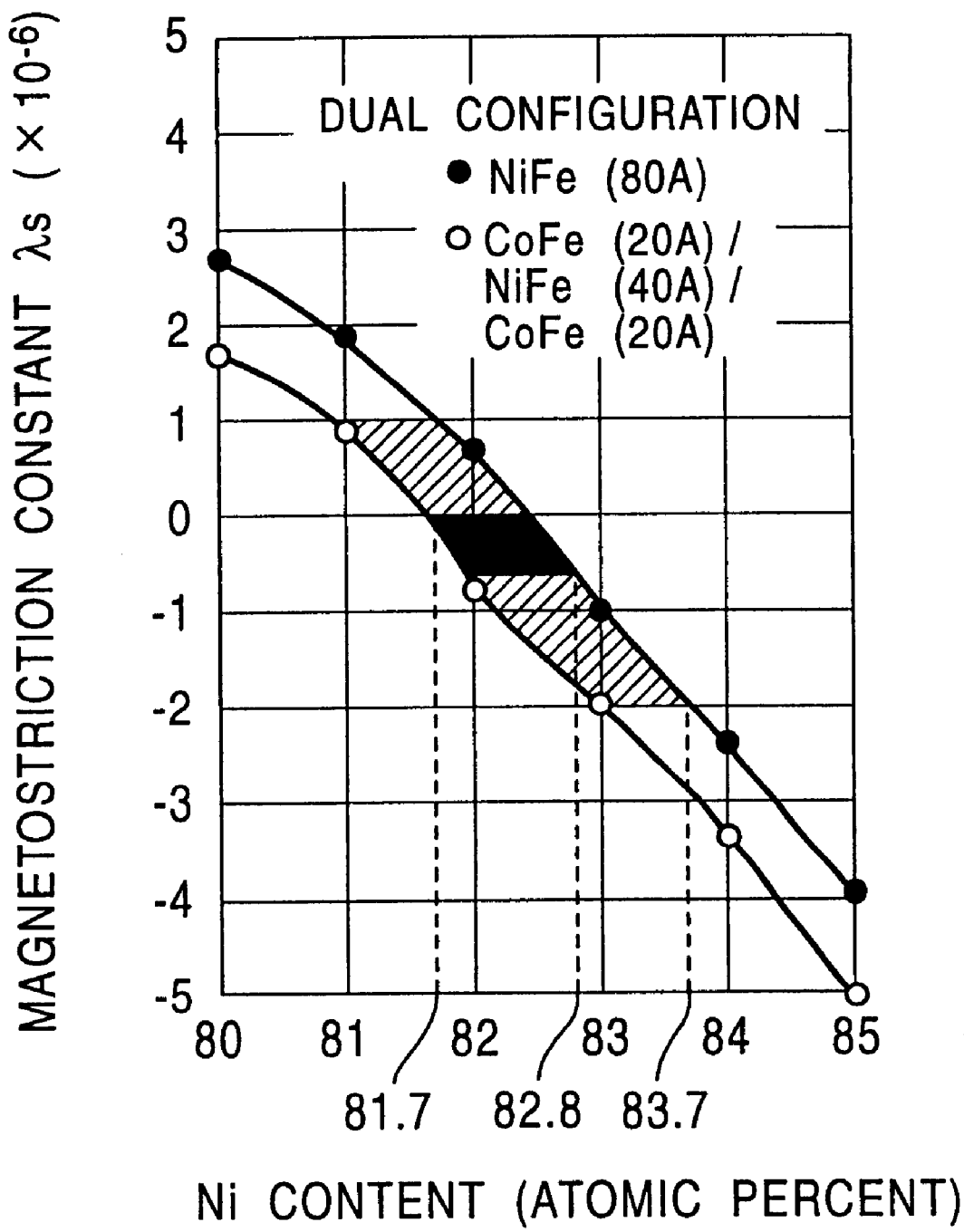
FIG. 18 is a graph showing the relationship between the nickel content in the NiFe alloy and the magnetostriction constant λs in a spin-valve film including a free magnetic layer and antiferromagnetic layers formed above and below the free magnetic layer, in which the free magnetic layer includes a NiFe alloy film having a thickness of 80 Å, or includes a NiFe alloy film having a thickness of 40 Å and a CoFe alloy film having a thickness of 40 Å.

FIG. 18 is a graph the relationship between the nickel content in the NiFe alloy and the magnetostriction constant $\lambda s$ in the spin-valve film having the dual configuration. FIG. 18 shows that the magnetostriction constant $\lambda s$ of the free magnetic layer 5 could be controlled to be $-2 \times 10^{-6}$ to $1 \times 10^{6}$ when the nickel content was in a range of 81 to 83.7 atomic percent, and to be $-0.5 \times 10^{-6}$ to 0 when the nickel content was in a range of 81.7 to 82.8 atomic percent.

As shown in FIG. 7, when the magnetostriction constant is positive at a position (the central region) of the free magnetic layer 5 in which a tensile stress is applied, anisotropic magnetic dispersion due to magnetoelastic effects in the height direction (Y-axis direction) is increased. Thus, the magnetostriction constant of the free magnetic layer 5 is preferably positive as small as possible, and more preferably negative.

A large negative magnetostriction constant of the free magnetic layer 5 undesirably causes high anisotropic magnetic dispersion due to the magnetoelastic effect in the height direction (Y-axis direction) at the two end regions of the free magnetic layer 5 in which a compressive stress is applied. Accordingly, the magnetostriction constant of the free magnetic layer 5 is in a range of $-2 \times 10^{-6}$ to $1 \times 10^{-6}$, and more preferably $-0.5 \times 10^{-6}$ to 0.

When the thickness of the free magnetic layer 5 is in a range of 30 to 100 Å, the nickel content in a preferable NiFe alloy of the free magnetic layer 5 was experimentally determined (FIGS. 11 to 13).

When the antiferromagnetic layer 2 is formed above the free magnetic layer 5, as in the spin-valve type magnetoresistive thin film element shown in FIG. 1, the nickel content in the NiFe alloy is preferably controlled to be 82 to 85 atomic percent so that the magnetostriction constant of the free magnetic layer 5 is in a range of $-2 \times 10^{-6}$ to $1 \times 10^{-6}$, and more preferably controlled to be 82.7 to 84.2 atomic percent so that the magnetostriction constant of the free magnetic layer 5 is in a range of $-0.5 \times 10^{-6}$ to 0.

When the antiferromagnetic layer 2 is formed below the free magnetic layer 5, as in the spin-valve type magnetoresistive thin film element shown in FIG. 2, the nickel content in the NiFe alloy is preferably controlled to be 81 to 83 atomic percent so that the magnetostriction constant of the free magnetic layer 5 is in a range of $-2\times10^{-6}$ to $1\times10^{-6}$, and more preferably controlled to be 81.6 to 82.5 atomic percent so that the magnetostriction constant of the free magnetic layer 5 is in a range of $-0.5\times10^{-6}$ to 0.

When the antiferromagnetic layers 2 are formed above and below the free magnetic layer 5, as in the spin-valve type magnetoresistive thin film element shown in FIG. 3, the nickel content in the NiFe alloy is preferably controlled to be 81.7 to 84 atomic percent so that the magnetostriction constant of the free magnetic layer 5 is in a range of $-2\times10^{-6}$ to $1\times10^{-6}$, and more preferably controlled to be 82.3 to 83 atomic percent so that the magnetostriction constant of the free magnetic layer 5 is in a range of $-0.5\times10^{-6}$ to 0.

Accordingly, in the present invention, the thickness of the free magnetic layer 5 and the composition of the NiFe alloy of the free magnetic layer 5 are controlled within proper ranges so that the magnetostriction constant of the free magnetic layer 5 is in a range of $-2\times10^{-6}$ to $1\times10^{-6}$, and more preferably $-0.5\times10^{-6}$ to 0.

In the central region of the free magnetic layer 5 which is less affected by the hard magnetic bias layer 6, anisotropic magnetic dispersion in the height direction (Y-axis direction) due to a magnetoelastic effect is small, and an anisotropic magnetic field is generated by the magnetoelastic effect in the track width direction (X-axis direction). Thus, Barkhausen noise is reduced and a high rate of change in resistance is achieved.

Figure 4:
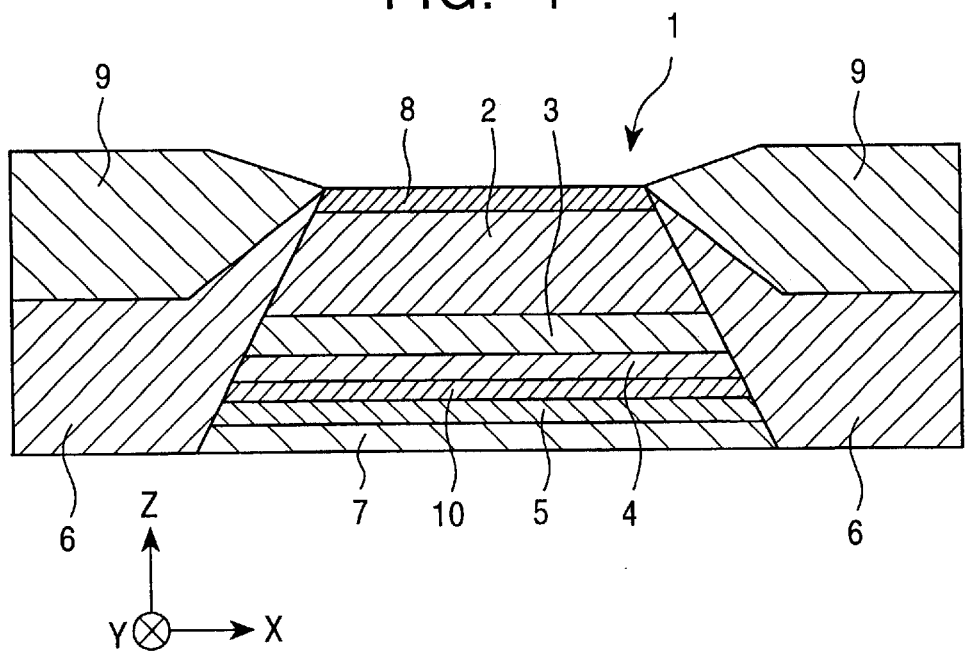
FIG. 4 is a cross-sectional view in the vicinity of an ABS of a spin-valve type magnetoresistive thin film element in a fourth embodiment of the present invention.
Figure 5:
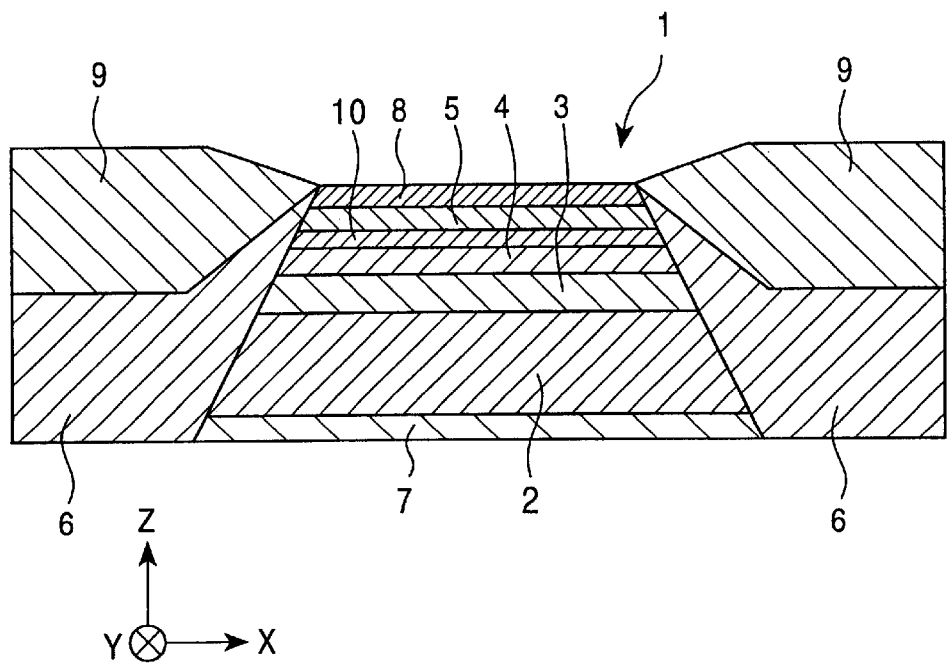
FIG. 5 is a cross-sectional view in the vicinity of an ABS of a spin-valve type magnetoresistive thin film element in a fifth embodiment of the present invention.
Figure 6:
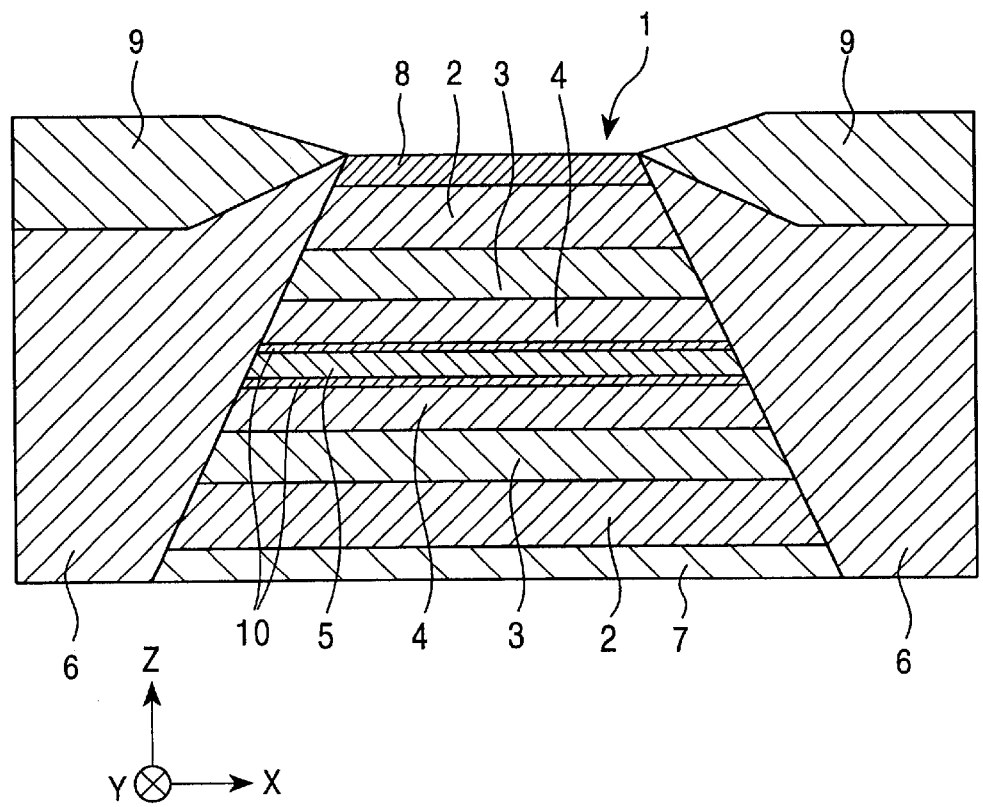
FIG. 6 is a cross-sectional view in the vicinity of-an ABS of a spin-valve type magnetoresistive thin film element in a sixth embodiment of the present invention.

FIGS. 4 to 6 are cross-sectional views in the vicinity of ABSs of spin-valve type magnetoresistive thin film elements in a fourth embodiment, a fifth embodiment and a sixth embodiment, respectively, of the present invention, for sensing recorded magnetic fields from recording media, such as hard disks.

In a spin-valve type magnetoresistive thin film element 1 shown in each of FIGS. 4 to 6, the free magnetic layer 5 has a layered configuration of a free magnetic sublayer 5 composed of a NiFe alloy and a free magnetic sublayer 10 composed of a cobalt alloy or metallic cobalt. Other film configurations are the same as that in FIGS. 1 to 3.

As shown in FIGS. 4 to 6, the cobalt-based free magnetic sublayer 10 is preferably formed so as to come into contact with the nonmagnetic electrically conductive layer 4. Such a configuration causes a high rate of change in resistance, as shown in FIG. 11, and thus causes a large output of the head.

The total thickness of the free magnetic sublayer 5 and the free magnetic sublayer 10 is preferably in a range of 30 to 100 Å. Furthermore, the ratio of the free magnetic sublayer 10 composed of a cobalt alloy or metallic cobalt to the total thickness of the free magnetic sublayers 5 and 10 is preferably in a range of 0 to 0.5. In addition, the thickness of the cobalt-based free magnetic sublayer 10 is preferably in a range of 0 to 40 Å. By a proper combination of the above-specified total thickness of the free magnetic sublayers, the above-specified thickness of the free magnetic sublayer 10, and the above-specified Ni content in the NiFe alloy of the free magnetic sublayer 5, the magnetostriction constant λs of the free magnetic sublayers 5 and 10 can be controlled to be $-2\times10^{-6}$ to $1\times10^{-6}$, and more preferably $-0.5\times10^{-6}$ to 0.

A preferable nickel content in the NiFe alloy was experimentally determined when the free magnetic layer 5 has a layered configuration of a free magnetic sublayer 5 composed of a NiFe alloy and a free magnetic sublayer 10 composed of a CoFe alloy, when the total thickness of the free magnetic sublayers 5 and 10 is 80 Å, and when the thickness of the free magnetic sublayer 10 is 0 to 40 Å (see FIGS. 15 to 17).

When the antiferromagnetic layer 2 is formed above the free magnetic sublayers 5 and 10, as in the spin-valve type magnetoresistive thin film element shown in FIG. 4, the nickel content in the NiFe alloy is preferably controlled to be 82 to 85 atomic percent so that the magnetostriction constant of the free magnetic sublayers 5 and 10 is in a range of $-2\times10^{-6}$ to $1\times10^{-6}$ and more preferably controlled to be 83 to 84 atomic percent so that the magnetostriction constant of the free magnetic sublayers 5 and 10 is in a range of $-0.5\times10^{-6}$ to 0.

When the antiferromagnetic layer 2 is formed below the free magnetic sublayers 5 and 10, as in the spin-valve type magnetoresistive thin film element shown in FIG. 5, the nickel content in the NiFe alloy is preferably controlled to be 80 to 83 atomic percent so that the magnetostriction constant of the free magnetic sublayers 5 and 10 is in a range of $-2\times10^{-6}$ to $1\times10^{-6}$, and more preferably controlled to be 81 to 82 atomic percent so that the magnetostriction constant of the free magnetic sublayers 5 and 10 is in a range of $-0.5\times10^{-6}$ to 0.

When the antiferromagnetic layers 2 are formed above and below the free magnetic sublayers 5 and 10, as in the spin-valve type magnetoresistive thin film element shown in FIG. 6, the nickel content in the NiFe alloy is preferably controlled to be 81 to 83.7 atomic percent so that the magnetostriction constant of the free magnetic sublayers 5 and 10 is in a range of $-2\times10^{-6}$ to $1\times10^{-6}$, and more preferably controlled to be 81.7 to 82.8 atomic percent so that the magnetostriction constant of the free magnetic sublayers 5 and 10 is in a range of $-0.5\times10^{-6}$ to 0.

Accordingly, in the present invention, the thicknesses of the free magnetic sublayers 5 and 10 and the composition of the NiFe alloy of the free magnetic layer 5 are controlled-within proper ranges so that the magnetostriction constant of the free magnetic sublayers 5 and 19 is in a range of $-2\times10^{-6}$ to $1\times10^{-6}$ and more preferably $-0.5\times10^{-6}$ to 0.

In the central region of the free magnetic sublayers 5 and 10 which are less affected by the hard magnetic bias layer 6, anisotropic magnetic dispersion in the height direction (Y-axis direction) due to the magnetoelastic effect is small, and an anisotropic magnetic field is generated by the magnetoelastic effect in the track width direction (X-axis direction). The magnetization can, therefore, be properly oriented in the track width direction (X-axis direction) over the entire free magnetic sublayers 5 and 10. Thus, Barkhausen noise is reduced and a high rate of change in resistance is achieved.

As described above, when the thickness of the free magnetic layer 5 composed of a NiFe alloy is within a range of 30 to 100 Å, and when the composition of the NiFe alloy is properly determined, the magnetostriction constant of the free magnetic layer 5 can be controlled to be $-2\times10^{-6}$ to $1\times10^{-6}$, and more preferably $-0.5\times10^{-6}$ to 0.

Alternatively, when the thickness of the composite free magnetic layer 5 composed of a NiFe alloy sublayer and a metallic cobalt or Co alloy sublayer is within a range of 30 to 100 Å, when the ratio of the thickness of the metallic cobalt or Co alloy sublayer to the total thickness of the free magnetic layer 5 is within a range of 0 to 0.5, and when the composition of the NiFe alloy is properly determined, the magnetostriction constant of the free magnetic layer 5 can be controlled to be $-2\times10^{-6}$ to $1\times10^{-6}$, and more preferably $-0.5\times10^{-6}$ to 0.

The above-specified magnetostriction constant of the free magnetic layer 5 can reduce anisotropic magnetic dispersion in the height direction due to a magnetoelastic effect in the central region of the free magnetic layer 5 which is less affected by the hard magnetic bias layer and which is under a tensile stress. In addition, a magnetic field due to a magnetoelastic effect can be generated in the track width direction in the central region.

Accordingly, the magnetization in the entire region of the free magnetic layer 5 can be properly oriented in the track width direction, resulting in reduced Barkhausen noise and a high rate of change in resistance.

What is claimed is:

1. A spin-valve type magnetoresistive thin film element comprising:
   a antiferromagnetic layer;
   a pinned magnetic layer in contact with the antiferromagnetic layer, the magnetization direction of the pinned magnetic layer being fixed by an anisotropic exchange magnetic field exchanged with the antiferromagnetic layer;
   a nonmagnetic electrically conductive layer formed between the pinned magnetic layer and a free magnetic layer;
   a bias layer for orienting the magnetization of the free magnetic layer to a direction intersecting the magnetization direction of the pinned magnetic layer; and
   an electrically conductive layer for supplying a sensing current to the pinned magnetic layer, the nonmagnetic electrically conductive layer and the free magnetic layer;
   wherein the free magnetic layer comprises a NiFe alloy film and has a thickness in a range of 30 to 100 angstrom,
   wherein said antiferromagnetic layer comprises two antiferromagnetic layers, one of said two antiferromagnetic layers being formed above and the other of said two antiferromagnetic layers being formed below the free magnetic layer, and
   wherein the NiFe alloy film, as the constituent of the free magnetic layer, has a Ni content in a range of 81.7 to 84 atomic percent.

2. A spin-valve type magnetoresistive thin film element according to claim 1, wherein the NiFe alloy film, as the constituent of the free magnetic layer, has a Ni content in a range of 82.3 to 83 atomic percent.

3. A spin-valve type magnetoresistive thin film element according to claim 2, wherein the magnetostriction constant of the free magnetic layer is $-0.5 \times 10^{-6}$ to 0.

4. A spin-valve type magnetoresistive thin film element according to claim 1, wherein the antiferromagnetic layers each comprise a PtMn alloy film.

5. A spin-valve type magnetoresistive thin film element according to claim 1, wherein the antiferromagnetic layers each comprise an alloy selected from an X—Mn alloy wherein X is at least one element selected from the group consisting of Pd, Ru, Ir, Os, and Rh, and a Pt—Mn—X' alloy wherein X' is at least one element selected from the group consisting of Ni, Pd, Rh, Ru, Ir, Os, Cr, and Co.

6. A spin-valve type magnetoresistive thin film element according to claim 1, wherein the magnetostriction constant of the free magnetic layer is $-2 \times 10^{-6}$ to $1 \times 10^{-6}$.

7. A spin-valve type magnetoresistive thin film element according to claim 1, further comprising another nonmagnetic electrically conductive layer formed on the film plane of the free magnetic layer, which is not adjacent to the nonmagnetic electrically conductive layer, another pinned magnetic layer formed on the film plane of the other nonmagnetic electrically conductive layer, which is not adjacent to the free magnetic layer, and another antiferromagnetic layer formed on the film plane of the other pinned magnetic layer, which is not adjacent to the other nonmagnetic electrically conductive layer, the electrically conductive layer supplying a sensing current to the pinned magnetic layer, the nonmagnetic electrically conductive layer, the free magnetic layer, the other nonmagnetic electrically conductive layer, and the other pinned magnetic layer.

8. A spin-valve type magnetoresistive thin film element comprising:
   a antiferromagnetic layer;
   a pinned magnetic layer in contact with the antiferromagnetic layer, the magnetization direction of the pinned magnetic layer being fixed by an anisotropic exchange magnetic field exchanged with the antiferromagnetic layer;
   a nonmagnetic electrically conductive layer formed between the pinned magnetic layer and a free magnetic layer;
   a bias layer for orienting the magnetization of the free magnetic layer to a direction intersecting the magnetization direction of the pinned magnetic layer; and
   an electrically conductive layer for supplying a sensing current to the pinned magnetic layer, the nonmagnetic electrically conductive layer and the free magnetic layer;
   wherein the free magnetic layer comprises a layered structure of a NiFe alloy film and a metallic cobalt or cobalt alloy film and has a thickness in a range of 30 to 100 angstrom, the ratio of the thickness of said metallic cobalt or cobalt alloy film to the thickness of the free magnetic layer being in a range of 0 to 0.5,
   wherein said antiferromagnetic layer comprises two antiferromagnetic layers, one of said two antiferromagnetic layers being formed above and the other of said two antiferromagnetic layers being formed below the free magnetic layer, and
   wherein the NiFe alloy film, as the constituent of the free magnetic layer, has a Ni content in a range of 81 to 83.7 atomic percent.

9. A spin-valve type magnetoresistive thin film element according to claim 8, wherein the thickness of said metallic cobalt or cobalt alloy film is in a range of 0 to 40 Å.

10. A spin-valve type magnetoresistive thin film element according to claim 8, wherein said metallic cobalt or cobalt alloy film is formed so as to come into contact with the nonmagnetic electrically conductive layer.

11. A spin-valve type magnetoresistive thin film element according to claim 8, wherein the NiFe alloy film, as the constituent of the free magnetic layer, has a Ni content in a range of 81.7 to 82.8 atomic percent.

12. A spin-valve type magnetoresistive thin film element according to claim 11, wherein the magnetostriction constant of the free magnetic layer is $-0.5 \times 10^{-6}$ to 0.

13. A spin-valve type magnetoresistive thin film element according to claim 8, wherein the antiferromagnetic layers each comprise a PtMn alloy film.

14. A spin-valve type magnetoresistive thin film element according to claim 8, wherein the antiferromagnetic layers each comprise an alloy selected from an X—Mn alloy wherein X is at least one element selected from the group consisting of Pd, Ru, Ir, Os, and Rh, and a Pt—Mn—X' alloy wherein X' is at least one element selected from the group consisting of Ni, Pd, Rh, Ru, Ir, Os, Cr, and Co.

15. A spin-valve type magnetoresistive thin film element according to claim 8, wherein the Co alloy layer comprises a CoFe alloy.

16. A spin-valve type magnetoresistive thin film element according to claim 8, wherein the magnetostriction constant of the free magnetic layer is $-2\times10^{-6}$ to $1\times10^{-6}$.

17. A spin-valve type magnetoresistive thin film element according to claim 8, further comprising another nonmagnetic electrically conductive layer formed on the film plane of the free magnetic layer, which is not adjacent to the nonmagnetic electrically conductive layer, another pinned magnetic layer formed on the film plane of the other nonmagnetic electrically conductive layer, which is not adjacent to the free magnetic layer, and another antiferromagnetic layer formed on the film plane of the other pinned magnetic layer, which is not adjacent to the other nonmagnetic electrically conductive layer, the electrically conductive layer supplying a sensing current to the pinned magnetic layer, the nonmagnetic electrically conductive layer, the free magnetic layer, the other nonmagnetic electrically conductive layer, and the other pinned magnetic layer.

18. A spin-valve type magnetoresistive thin film element according to claim 17, wherein the free magnetic layer comprises a NiFe layer and a pair o the Co or Co alloy layers formed above and below the NiFe alloy, the thickness of the Co or Co alloy layers being the total of the pair of the layers.

19. A spin-valve type magnetoresistive thin film element according to claim 18, wherein each of the Co alloy layers comprises a CoFe alloy.

20. A spin-valve type magnetoresistive thin film element according to claim 19, wherein each of the antiferromagnetic layers comprises a PtMn alloy film.

21. A spin-valve type magnetoresistive thin film element according to claim 19, wherein each of the antiferromagnetic layers comprises an alloy selected from an X—Mn alloy wherein X is at least one element selected from the group consisting of Pd, Ru, Ir, Os, and Rh, and a Pt—Mn—X' alloy wherein X' is at least one element selected from the group consisting of Ni, Pd, Rh, Ru, Ir, Os, Cr, and Co.

* * * * *

UNITED STATES PATENT AND TRADEMARK OFFICE
CERTIFICATE OF CORRECTION

PATENT NO. : 6,301,089 B1  
DATED : October 9, 2001  
INVENTOR(S) : Masamichi Saito et al.

It is certified that error appears in the above-identified patent and that said Letters Patent is hereby corrected as shown below:

<u>Title page,</u>  
Item [57], ABSTRACT,  
Line 16, delete "be $-2\text{x}10^{-6}$to" and substitute -- be $-2\text{x}10^{-6}$ to -- in its place; and delete "preferably $-0.5\text{x}10^{-6}$" and substitute -- preferably $-0.5\text{x}10^{-7}$ -- in its place.

<u>Column 17,</u>  
Line 50, delete "is $-0.5\text{x}10^{-6}$" and substitute -- is $-0.5\text{x}10^{-7}$ -- in its place.

<u>Column 18,</u>  
Line 57, delete "is $-0.5\text{x}10^{-6}$" and substitute -- is $-0.5\text{x}10^{-7}$ -- in its place.

<u>Column 20,</u>  
Line 3, delete "pair o" and substitute -- pair of -- in its place.

Signed and Sealed this

Eighteenth Day of March, 2003

JAMES E. ROGAN  
*Director of the United States Patent and Trademark Office*